United States Patent [19]

Shiratori

[11] Patent Number: 5,943,489

[45] Date of Patent: Aug. 24, 1999

[54] LOGIC SIMULATION SYSTEM FOR LOGIC SIMULATION OF THE SEMICONDUCTOR INTEGRATED CIRCUIT

[75] Inventor: Akihiro Shiratori, Kanagawa, Japan

[73] Assignee: NEC Corporation, Tokyo, Japan

[21] Appl. No.: 08/826,232

[22] Filed: Mar. 27, 1997

[30] Foreign Application Priority Data

Mar. 28, 1996 [JP] Japan ..................................... 8-073695

[51] Int. Cl.$^6$ ................................................. G06F 9/455
[52] U.S. Cl. .................. 395/500.37; 395/500.06
[58] Field of Search ..................... 364/578, 488, 364/489, 490, 491

[56] References Cited

U.S. PATENT DOCUMENTS

| | | | |
|---|---|---|---|
| 5,258,919 | 11/1993 | Yamanouchi et al. | 364/489 |
| 5,329,471 | 7/1994 | Swoboda et al. | 364/578 |
| 5,353,243 | 10/1994 | Read et al. | 364/578 |
| 5,452,239 | 9/1995 | Dai et al. | 364/578 |
| 5,621,651 | 4/1997 | Swoboda | 364/489 |
| 5,727,221 | 3/1998 | Walsh et al. | 395/750 |
| 5,784,291 | 7/1998 | Chen et al. | 364/491 |
| 5,841,670 | 11/1998 | Swoboda | 364/578 |

FOREIGN PATENT DOCUMENTS 63-98042  4/1988  Japan .

*Primary Examiner*—Eric W. Stamber
*Assistant Examiner*—Russell W. Frejd
*Attorney, Agent, or Firm*—Whitham, Curtis & Whitham

[57] ABSTRACT

A logic simulation system which comprises a connection data conversion section to convert the format of the connection data, a dump data generation section to generate and output the dump data, a data pattern generation section to generate and output the data pattern reflecting the chip inside variation, a clock pattern generation section to generate and output the clock pattern reflecting the chip inside variation, an expectation pattern generation section to generate and output the expectation pattern, a logic verification pattern generation section to synthesize the data pattern, the clock pattern and the expectation pattern and generates the logic verification pattern and an operation section to execute the logic simulation.

17 Claims, 19 Drawing Sheets

LOGIC SIMULATION SYSTEM FOR LOGIC SIMULATION OF THE SEMICONDUCTOR INTEGRATED CIRCUIT

BACKGROUNDS OF THE INVENTION

1. Field of the Invention

The present invention relates to a logic simulation on system which simulation the logic operation of the semiconductor integrated circuit using a computer system and particularly relates to a logic simulation system for the logic simulation considering variation inside the chip within the semiconductor integrated circuit.

2. Description of the Related Art

The computerized logic simulation system for simulation of the logic operation applicable to semiconductor integrated circuit has been developed. In such a logic simulation system, in general, the logic cells used for execution of the logic simulation have, in a library, delay values within the variation range of the fabrication conditions for the semiconductor integrated circuit as the subject of the simulation. For each logic cell inside the semiconductor integrated circuit, the delay value is determined by adding the wiring delay to the delay value in such library. Therefore, the logic cells having the same function name and the same wiring length have the same delay value in the logic simulation.

In a chip in reality (actual chip), however, there are slight variations in wire diameter and thickness and gate oxide film thickness because of fabrication factors, which results in variation in delay values. Such variation is called the chip inside variation. When there are some chip inside variations in the route of the signal input to the combination circuit, they just change the delay time in the combination circuit and cause any affect logically. However, when the chip inside variation exists in the route of the signal input to a logic cell in the flip-flop (F/F) system, it may change not only the delay time but also the output logic from the logic cell in the F/F system For example, when the F/E' has a large chip inside variation, the signal route on the clock side and a small variation in the signal route on the data side, the F/F setup specification or the hold specification is not satisfied.

To execute the logic simulation considering the chip inside variation, different delay values need to be provided to the logic cells having the same function. However whether the delay should be increased or decreased for chip inside variation depends on the signal route, and such delay values cannot be determined until the connection relations between the logic cells are fixed. Further, when the signal route is branched, the variation tendency cannot be determined for the logic cells existing on the signal route before such branch. Therefore, such simulation cannot be executed by the ordinary logic simulation method using the above conventional logic simulation system.

A method to provide different delay values to the logic cells having the same function in the logic simulation has been conventionally proposed. A conventional logic simulation method of this type is the technology disclosed in Japanese Patent Application Laid-open (Kukai) No. Heisei 63-98042 "Simulation Method".

FIG. 21 is a flowchart illustrating in general the logic simulation processing described in the above laid-open invention. Referring to the figure, the connection data and the logic verification pattern are read at Step 2101. At Step 2102, a table to store delay values is prepared. In this case, the table has a width corresponding to the total number of logic cells "N" contained in the connection data and a depth corresponding to the pattern length "M" of the logic verification pattern. Then, at Step 2103, delay values for the logic cells contained in the connection data are determined by the formula (1) below according to the standard value (TYP), the maximum value (MAX) and the minimum value (MIN) of the logic cell delay in the delay library.

$$\text{Delay value} = MIN + (MAX - MIN) \times (\text{random number}) \quad (1)$$

Calculation using formula (1) is executed for the number of logic verification patterns for all logic cells contained in the connection data. The calculation results are stored as the delay values on the table. The random number in the above formula (1) is the distribution function most approximated to the actual logic cell variation. For example, the random number based on the normal distribution may be supposed. The above procedure from Step 2101 to step 2103 is executed as the pre-processing of the logic simulation.

At Step 2104, the delay value for the logic cells stored at the first item pattern on the table are read. At Step 2105, using the connection data, the logic verification pattern and the table, the delay value on the table corresponding to the first pattern in the logic verification patterns is read out so that the operation analysis with certain logic simulation processing is executed. The delay values for the logic cells on the table are set approximately to the actual variations in the range from the minimum value (MIN) to the maximum value (MAX). Thus, the chip inside variation for all logic cells can be verified.

At Step 2106, the result of the operation analysis executed at step 2105 is output. At Step 2107, it is judged whether the pattern subjected to processing from Step 2104 to Step 2106 is the final item pattern of the table or not. If it is not the final pattern, the system returns to the processing at step 2104, reads the delay value stored at the next item pattern on the table and proceeds to the operation analysis (Step 2105) and the analysis result output (Step 2106).

If, at Step 2107, the pattern subjected to the processing from Step 2104 to Step 2106 is the pattern of the final item on the table, the processing is terminated.

As described above, a conventional logic simulation system in general extracts some values suitable for certain fabrication condition in advance from the delay value library as the delay values for the logic cell to be referred to and, with the delay value for each logic cell inside a chip fixed, calculates the response to the applied pattern. This enables high speed operation processing. However, since the delay value for each logic cell is fixed inside the chip, it cannot always execute the logic simulation correctly.

On the other hand, the above conventional logic simulation system citing the delay value for each logic cell from the table for each pattern can correctly reflect the delay value for each logic cell, but it takes time for processing since it requires a step to refer to the table to cite a delay value.

In addition, the above table has a size defined by (Total number of logic cells N)×(Pattern length M). When the scale of the semiconductor integrated circuit becomes large and the pattern length becomes longer, it takes time to prepare the table and requires an excessively large memory size for table preparation, which results in cost increase.

Further, since the delay values are set without paying attention to the signal route of the flip-flop, variation in the delay values are averaged when there are many logic steps in the signal route. In such case, whether there is any problem about operation timing cannot be verified.

Besides, the simulation results obtained by the above conventional logic simulation system only tells whether or not there is any problem about variation effect. Even when there is a problem about internal timing, it cannot specify the F/F causing such problem.

SUMMARY OF THE INVENTION

An object of the present invention is to provide a logic simulation system which enables high-speed simulation processing without using a delay table for determination of delay values for logic cells.

Another object of the present invention is to provide a logic simulation system which can properly verify whether or not there is any problem for each signal route even when there are many logic steps in the signal route by enabling the logic verification focusing on the signal route for the flip-flop logic cells.

Still another object of the present invention is to provide a logic simulation system which can specify any F/F logic cell contained in the logic cell and easily analyze whether there is any internal timing problem about the corresponding signal route. According to one aspect of the invention, a logic simulation system for simulation of the logic operation in semiconductor integrated circuits, comprises:

a connection data conversion means for inputting connection data, and converting said first connection data to second connection data in a certain format by separating flip-flop system logic cells from said fist connection data;

a dump data generation means for inputting said first connection data and logic verification pattern and generating dump data;

a data pattern generation means for inputting said dump data generated by said dump data generation means, extracting dump data at data input terminal, reset input terminal and set input terminal of the flip-flop system logic cells contained in said dump data and generating data pattern reflecting chip inside variation;

a clock pattern generation means for inputting said dump data generated by said dump data generation means, extracting dump data at clock input terminal of the flip-flop system logic cells contained in said dump data and generating clock pattern reflecting the chip inside variation;

an expectation pattern generation means for inputting said dump data generated by said dump data generation means, extracting dump data at data output terminal of the flip-flop system logic cells contained in said dump data and outputting them as the expectation pattern;

a logic verification pattern generation means for synthesizes said data pattern generated by said data pattern generation means, said clock pattern generated by said clock pattern generation means and said expectation pattern generated by said expectation pattern generation means and generating the logic verification pattern through processing according to said second connection data output from said connection data conversion means; and an operation means for inputting said logic verification pattern generated by said logic verification pattern generation means and said second connection data output from said connection data conversion means and executing logic simulation.

In the preferred construction, the connection data conversion means further comprises a retrieval means for inputting said first connection data and retrieving said flip-flop system logic cells contained in said first connection data, a terminal generation means for generating the same number of external terminals as a total of terminals used for signals in the flip-flop system logic cells detected by said retrieval means, a flip-flop extraction means for extracting said flip-flop system logic cells detected by said retrieval means, and a connection data output means for generating and outputting said second connection data to connect terminals of the flip-flop system logic cells extracted by said flip-flop extraction means and the external terminals generated by said terminal generation means in one-to-one relation.

In the preferred construction, the connection data conversion means further comprises a hierarchy expand means for inputting said first connection data and converting it to connection data with the hierarchical structure expanded to the logic cell level, a retrieval means for retrieving said flip-flop system logic cells contained in said connection data converted by said hierarchy expand means, a terminal generation means for generating the same number of external terminals as a total or terminals used for signals in the flip-flop system logic cells detected by said retrieval means, a flip-flop extraction means for extracting the flip-flop system logic cells detected by said retrieval means, and a connection data output means for generating and outputting said second connection data to connect terminals of the flip-flop system logic cells extracted by said flip-flop extraction means and the external terminals generated by said terminal generation means in one-to-one relation.

In the preferred construction, the connection data conversion means further comprises a flip-flop specification means for inputting said first connection data and specifying as the subject of processing one or more flip-flop system logic cell from the flip-flop system logic cells contained in said first connection data, a terminal generation means for generating the same number of external terminals as a total of terminals used for signals in the flip-flop system logic cell specified by said flip-flop specification means, a flip-flop extraction means for extracting the flip-flop system logic cells detected by said retrieval means, and a connection data output means for generating and outputting said second connection data to connect terminals of the flip-flop system logic cells extracted by said flip-flop extraction means and the external terminal generated by said terminal generation means in one-to-one relation.

In another preferred construction, the dump data generation means further comprises a second operation means for inputting said first connection data and said logic verification pattern and executing the logic simulation, a dump cell specification means, after the logic simulation execution by said second operation means, or specifying one or more logic cell contained in said connection data, and a dump data output means for outputting change time and status value of the logic cell specified by said dump cell specification means as the dump data.

In another preferred construction, the dump data generation means further comprises a second operation means for inputting said first connection data and said logic verification pattern and executing the logic simulation, a dump cell specification means, after the logic simulation execution by said second operation means, for specifying one or more logic cell contained in said connection data, and a dump data output means for outputting change time and status value of the logic cell specified by said dump cell specification means as the dump data, wherein said second operation means is provided with a library storing delay values for the logic cells corresponding to a plurality of predetermined fabrication conditions, and obtains library data related to fabrication conditions specified for execution of the logic simulation by referring to said library and executes the logic simulation.

In another preferred construction, the dump data generation means further comprises a second operation means for inputting said first connection data and said logic verification pattern and executing the logic simulation, and a dump data output means for outputting a result of the logic simulation by said second operation means as the dump data.

In the above-mentioned construction, the dump data generation means further comprises a second operation means for inputting said first connection data and said logic verification pattern and executing the logic simulation, and a dump data output means for outputting a result of the logic simulation by said second operation means as the dump data, wherein said second operation means is provided with a library storing delay values for the logic cells corresponding to a plurality of predetermined fabrication conditions, obtains library data related to the fabrication condition specified for execution of the logic simulation by referring to said library and executes the logic simulation.

In the above-mentioned construction, the data pattern generation means further comprises a time slot division means for dividing change time in the dump data input from said dump data generation means to time slot units having the predetermined cycles, a subtraction means for subtracting the start time of said time slot from the change time at the data input terminal, the reset input terminal and the set input terminal of the flip-flop system logic cell contained in the time slot divided by said time slot division means, a multiplication means for multiplying the subtraction result obtained by said subtraction means by first chip inside variation coefficient, which is set so as to decrease the timing margin between the signal route for the clock input and the signal route for any signal input other than the clock signal in said flip-flop system logic cell, an addition means for adding the multiplication result obtained by said multiplication means and the start time of said time slot, and a data pattern output means for outputting the addition result obtained by said addition means as the data pattern.

In the above-mentioned construction, the clock pattern generation means further comprises a time slot division means for dividing change time in the dump data input from said dump data generation means to time slot units having the predetermined cycles, a subtraction means for subtracting the start time of said time slot from the change time at the clock input terminal of the flip-flop system logic cell contained in the time slot divided by said time slot division means, a multiplication means for multiplying the subtraction result obtained by said subtraction means by the second chip inside variation coefficient, which is set so as to decrease the timing margin between the signal route for the clock input and the signal route for any signal input other than the clock signal in said flip-flop system logic cell, an addition means for adding the multiplication result obtained by said multiplication means and the start time of said time slot, and a data pattern output means for outputting the addition result obtained by said addition means as the clock pattern.

In another preferred construction, the logic verification pattern generation means further comprises a pattern synthesis means for synthesizing the data pattern output from said data pattern generation means, the clock pattern output from said clock pattern generation means and the expectation pattern output from said expectation pattern generation means, a terminal name correspondence means for changing terminal names used in the patterns synthesized by said pattern synthesis means to terminal names in the connection data output from said data conversion means and generating terminal name correspondence data, and a pattern output means for outputting pattern having the terminal names changed by said terminal name correspondence means as the logic verification pattern.

In another preferred construction, the logic verification pattern generation means further comprises a pattern synthesis means for synthesizing the data pattern output from said data pattern generation means, the clock pattern output from said clock pattern generation means and the expectation pattern output from said expectation pattern generation means, a terminal name correspondence means for changing terminal names used in the patterns synthesized by said pattern synthesis means to terminal names in the connection data output from said data conversion means and generating terminal name correspondence data, a pattern optimization means for deleting the pattern data of the logic cells not contained in the connection data output from said connection data conversion means among the terminal name correspondence data generated by said terminal name correspondence means before output, and a pattern output means fr outputting the pattern optimized by said pattern optimization means as the logic verification pattern In another preferred construction, the data pattern generation means further comprises a time slot division means for dividing change time in the dump data input from said dump data generation means to time slot units having the predetermined cycles, a subtraction means for subtracting the start time of said time slot from the change time at the data input terminal, the reset input terminal and the set input terminal of the flip-flop system logic cell contained in the time slot divided by said time slot division means, a multiplication means for multiplying the subtraction result obtained by said subtraction means by first chip inside variation coefficient, which is set so as to decrease the timing margin between the signal route for the clock input and the signal route for any signal input other than the clock signal in said flip-flop system logic cell, an addition means for adding the multiplication result obtained by said multiplication means and the start time of said time slot, and a data pattern output means for outputting the addition result obtained by said addition means as the data pattern, the clock pattern generation means further comprises a time slot division means for dividing change time ir the dump data input from said dump data generation means to time slot units having the predetermined cycles, a subtraction means for subtracting the stat time of said time slot from the change time at the clock input terminal of the flip-flop system logic cell contained in the time slot divided by said time slot division means, a multiplication means for multiplying the subtraction result obtained by said subtraction means by the second chip inside variation coefficient, which is set so as to decrease the timing margin between the signal route for the clock input and the signal route for any signal input other than the clock signal in said flip-flop system logic cell, an addition means for adding the multiplication result obtained by said multiplication means and the start time of said time slot, and a data pattern output means for outputting the addition result obtained by said addition means as the clock pattern, the logic verification pattern generation means further comprises a pattern synthesis means for synthesizing the data pattern output from said data pattern generation means, the clock pattern output from said clock pattern generation means and the expectation pattern output from said expectation pattern generation means, a terminal name correspondence means for changing terminal names used in the patterns synthesized by said pattern synthesis means to terminal names in the connection data output from said data conversion means and generating terminal name correspondence data, and a pattern output means for outputting pattern having the terminal names changed by said terminal name correspondence means as the logic verification pattern.

Also, the dump data generation means further comprises a second operation means for inputting said first connection data and said logic verification pattern and executing the logic simulation, a dump cell specification means, after the logic simulation execution by said second operation means, for specifying one or more logic cell contained in said connection data, and a dump data output means for outputting change time and status value of the logic cell specified by said dump cell specification means as the dump data, the data pattern generation means further comprises a time slot division means for dividing change time in the dump data input from said dump data generation means to time slot units having the predetermined cycles, a subtraction means for subtracting the start time of said time slot from the change time at the data input terminal, the reset input terminal and the set input terminal of the flip-flop system logic cell contained in the time slot divided by said time slot division means, a multiplication means for multiplying the subtraction result obtained by said subtraction means by first chip inside variation coefficient, which is set so as to decrease the timing margin between the signal route for the clock input and the signal route for any signal input other than the clock signal in said flip-flop system logic cell, an addition means for adding the multiplication result obtained by said multiplication means and the start time of said time slot, and a data pattern output means for outputting the addition result obtained by said addition means as the data pattern, the clock pattern generation means further comprises a time slot division means for dividing change time in the dump data input from said dump data generation means to time slot units having the predetermined cycles, a subtraction means for subtracting the start time of said time slot from the change time at the clock input terminal of the flip-flop system logic cell contained in the time slot divided by said time slot division means, a multiplication means for multiplying the subtraction result obtained by said subtraction means by the second chip inside variation coefficient, which is set so as to decrease the timing margin between the signal route for the clock input and the signal route for any signal input other than the clock signal in said flip-flop system logic cell, an addition means for adding the multiplication result obtained by said multiplication means and the start time of said time slot, and a data pattern output means for outputting the addition result obtained by said addition means as the clock pattern, the logic verification pattern generation means further comprises a pattern synthesis means for synthesizing the data pattern output from said data pattern generation means, the clock pattern output from said clock pattern generation means and the expectation pattern output from said expectation pattern generation means, a terminal name correspondence means for changing terminal names used in the patterns synthesized by said pattern synthesis means to terminal names in the connection data output from said data conversion means and generating terminal name correspondence data, and a pattern output means for outputting pattern having the terminal names changed by said terminal name correspondence means as the logic verification pattern.

Other objects, features and advantages of the present invention will become clear from the detailed description given herebelow.

BRIEF DESCRIPTION OF THE DRAWINGS

The present invention will be understood more fully from the detailed description given herebelow and from the accompanying drawings of the preferred embodiment of the invention, which, however, should not be taken to be limitative to the invention, but are for explanation and understanding only.

In the drawings.

DESCRIPTION OF THE PREFERRED EMBODIMENT

The preferred embodiment of the present invention will be discussed hereinafter in detail with reference to the accompanying drawings. In the following description, numerous specific details are set forth in order to provide a thorough understanding of the present invention. It will be obvious, however, to those skilled in the art that the present invention may be practiced without these specific details. In other instance, well-known structures are not shown in detail in order to unnecessary obscure the present invention.

Figure 1:
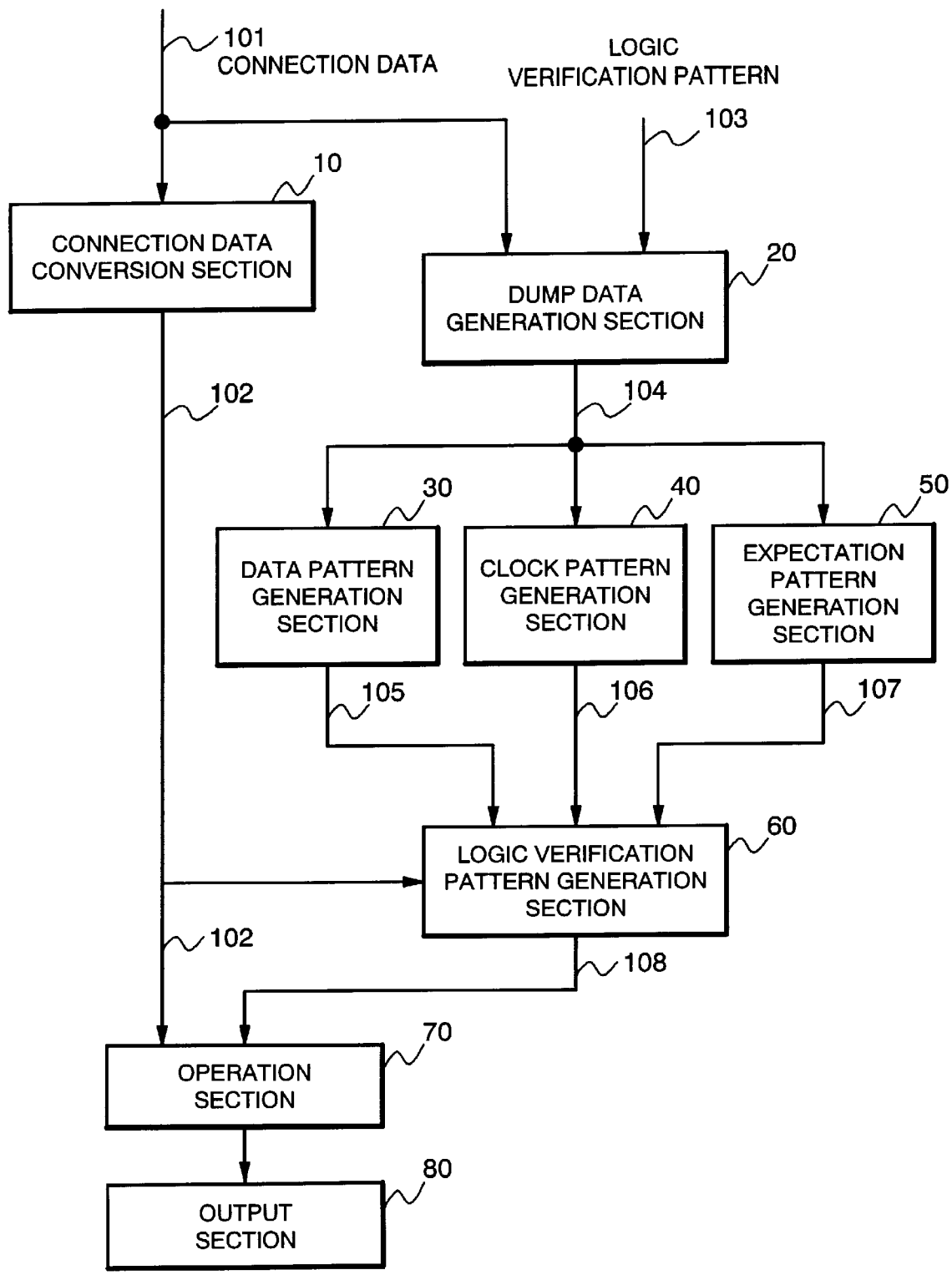
FIG. 1 is a block diagram to show the configuration of a logic simulation system according to an embodiment of the present invention.

FIG. 1 is a block diagram to show the configuration of a logic simulation system according to an embodiment of the present invention.

As shown in FIG. 1, a logic simulation system according to this embodiment comprises a connection data conversion section 10 to which connection data 101 is input for conversion, a dump data generation section 20 to which connection data 101 and logic verification pattern 103 are input and from which dump data 104 is output, a data pattern generation section 30, a clock pattern generation section 40 and an expectation pattern generation section 50 to which the dump data 104 output from the dump data generation section 20 is input for generation of a certain pattern respectively, a logic verification pattern generation section 60 to which the outputs from the data pattern generation section 30, the clock pattern generation section 40 and the expectation pattern generation section 50 are input so that a logic verification pattern 108 is output, an operation section 70 to which connection data 102 and logic verification pattern 108 are input for execution of the logic simulation and an output section 80 which outputs the result of the logic simulation execution by the operation section 70. Note that FIG. 1 just shows the characteristic configuration elements of this embodiment and omits other general configuration elements.

The logic simulation system of this embodiment is realized by a workstation or other computer systems. Among the above configuration elements, the connection data conversion section 10, the dump data generation section 20, the data pattern generation section 30, the clock pattern generation section 40, the expectation pattern generation section 50, the logic verification pattern generation section 60 and the operation section 70 are, for example, realized by the CPU controlled by a computer program and memories and other storages to store such computer program and certain data. The above computer program is provided as a record on magnetic disks or other storage media. The connection data 101 and the logic verification pattern 103 may be input from certain input terminals or may be prepared in advance and stored in a certain storage device so as to be read by the connection data conversion section 10 and the dump data generation section 20 at the start of the logic simulation. The output section 80 is achieved by a display unit, a printer or other output devices.

In the above configuration, the connection data conversion section 10 converts the input connection data 101 described in the standard format into the connection data 102 in the format used in this embodiment. In other words, it separates certain F/F system logic cells from the input connection data 101 to generate new connection data 102 and supplies the generated connection data 102 to the logic verification pattern generation section 60 and the operation section 70.

The dump data generation section 20, using the input connection data 101 and the logic verification pattern 103, cites delay values stored in the delay library in advance to execute the logic simulation and generates the dump data 104. It supplies the generated dump data 104 to the data pattern generation section 30, the clock pattern generation section 40 and the expectation pattern generation section 50. Note that the delay library in advance stores the delay values for the logic cells under a plurality of predetermined fabrication conditions and enables reference to the delay value for the logic cell corresponding to the fabrication condition specified in execution of the logic simulation.

The data pattern generation section 30 extracts the dump data of the data input terminal, the reset input terminal and the set input terminal in the F/F system logic cell contained in the dump data 104 received from the dump data generation section 20, generates a data pattern 105 by multiplying the change time of each input terminal by the first chip inside variation coefficient and supplying the generated data pattern 105 to the logic verification pattern generation section 60. The chip inside variation coefficient will be explained later.

The clock pattern generation section 40 extracts the dump data of the clock input terminal in the F/F system logic cell contained in the dump data 104 received from the dump data generation section 20, generates a clock pattern 106 by multiplying the change time of the clock input terminal by the second chip inside variation coefficient and supplies the generated clock pattern 106 to the logic verification pattern generation section 60. The chip inside variation coefficient will be explained later.

The expectation pattern generation section 50 extracts the dump data of the data output terminal in the F/F system logic cell contained in the dump data 104 received from the dump data generation section 20, generates an expectation pattern 107 and supplies the generated expectation pattern 107 to the logic verification pattern generation section 60.

The logic verification pattern generation section 60 synthesizes the data pattern 105, the clock pattern 106 and the expectation pattern 107 received respectively from the data pattern generation section 30, the clock pattern generation section 40 and the expectation pattern generation section 50 and executes processing according to the connection data 102 input from the connection data conversion section 10 to generate the logic verification pattern 108 and supplies the generated logic verification pattern 108 to the operation section 70.

The operation section 70 has as the input data the connection data 102 output from the connection data conversion section 10 and the logic verification pattern 108 output from the logic verification pattern generation section 60 and executes the logic simulation. Then, it outputs the simulation result to the output section 80.

The output section 80 receives the result of the logic simulation execution by the operation section 70 and displays it on the display unit screen or prints it out.

Next, referring to the flowcharts of FIGS. 2 to 6, the operation of this embodiment with the above configuration will be described below.

Figure 2:
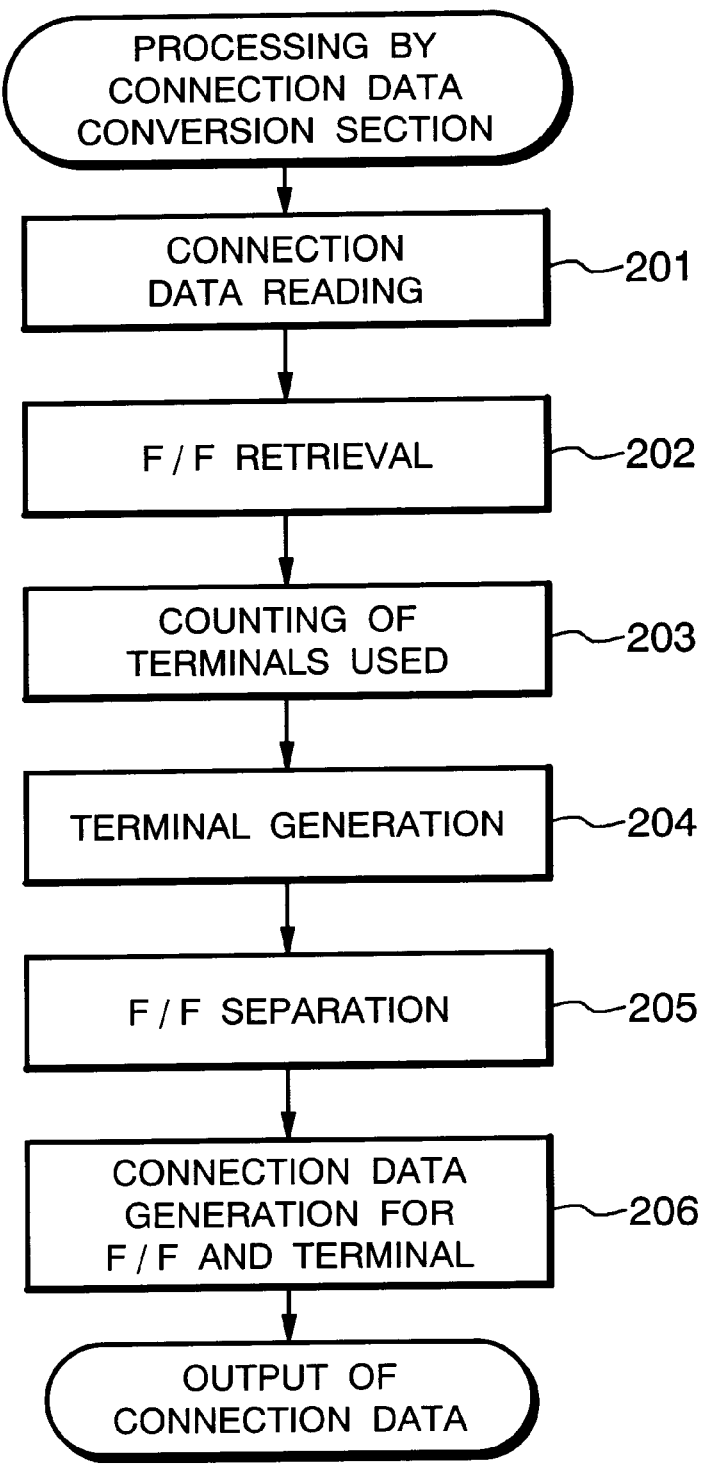
FIG. 2 is a flowchart illustrating the operation of the connection data conversion section.
Figure 3:
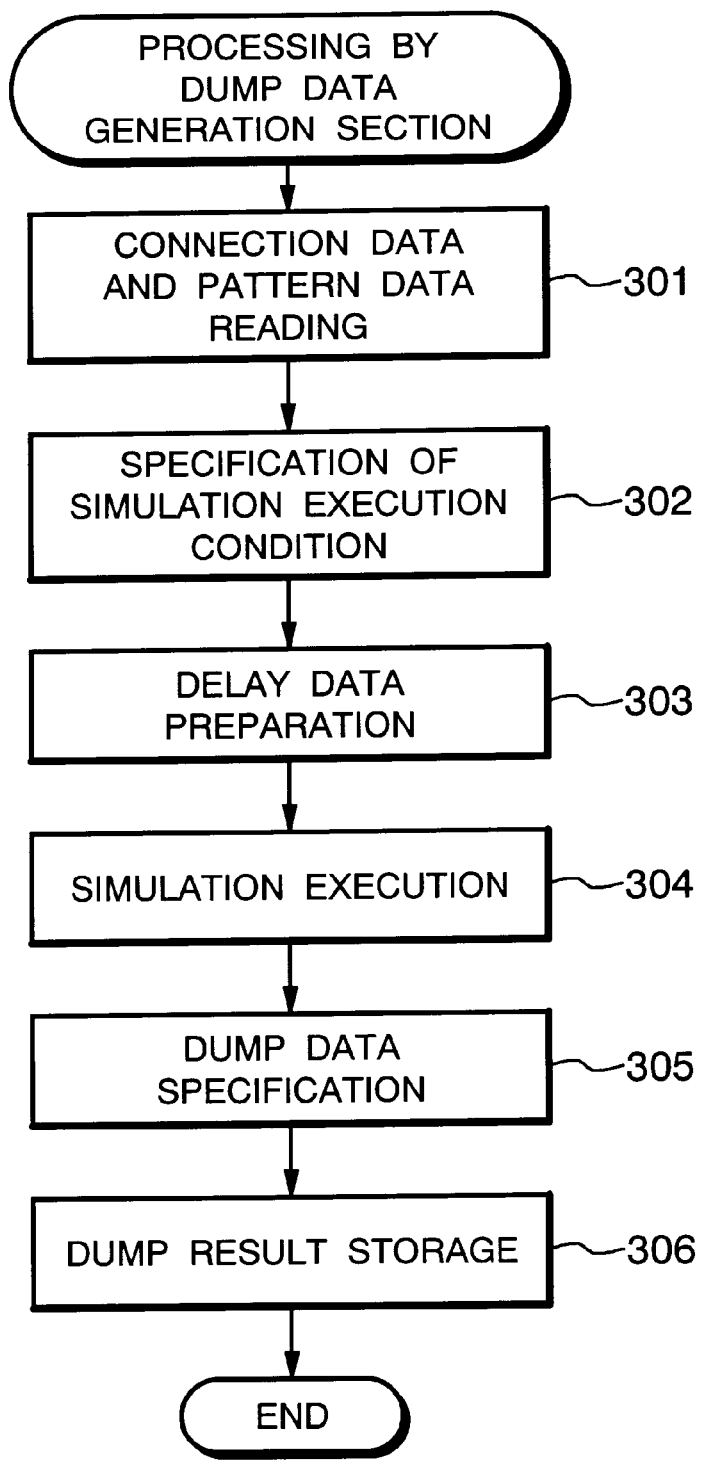
FIG. 3 is a flowchart illustrating the operation of the dump data generation section.
Figure 4:
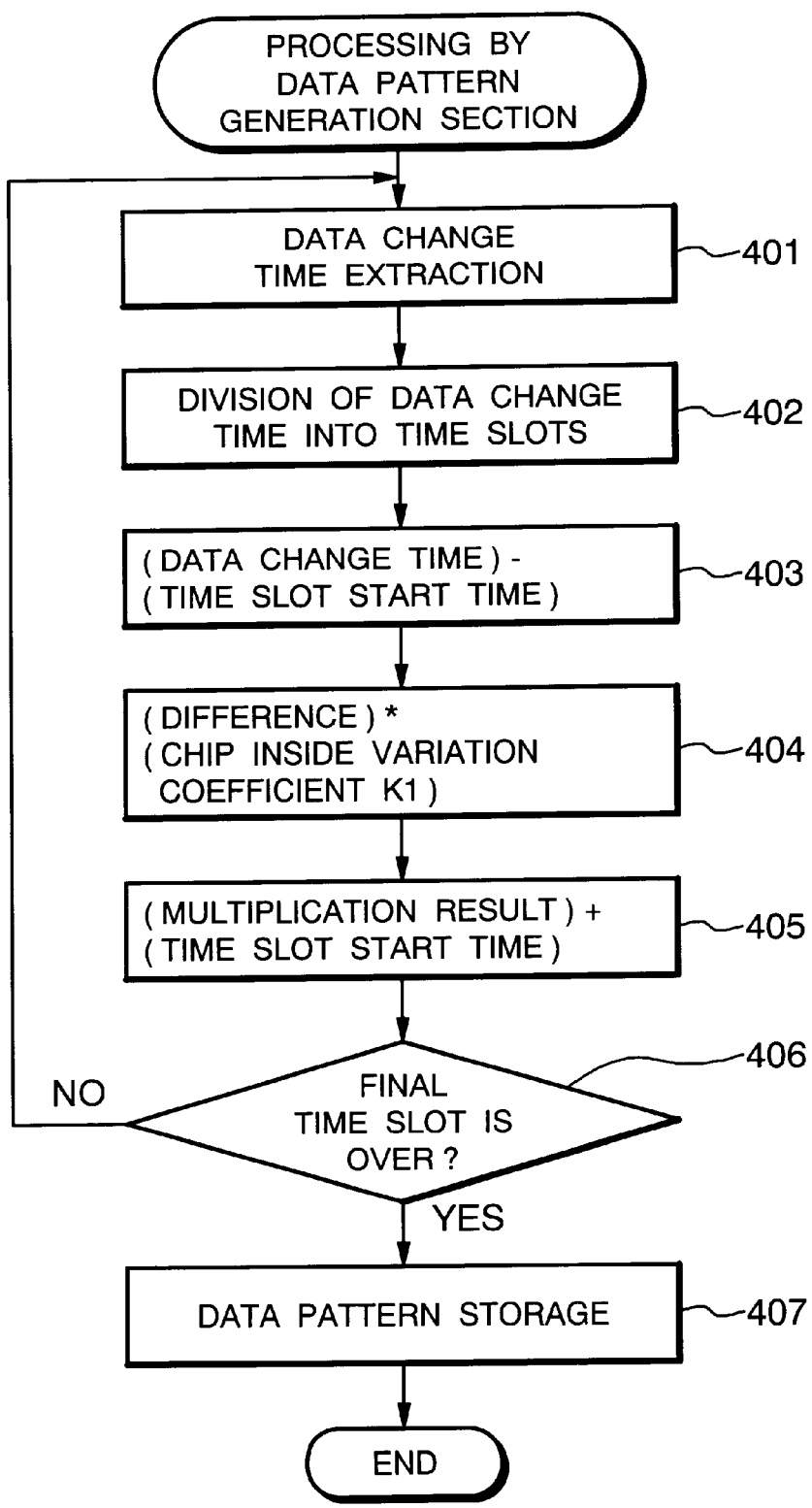
FIG. 4 is a flowchart illustrating the operation of the data pattern generation section.
Figure 5:
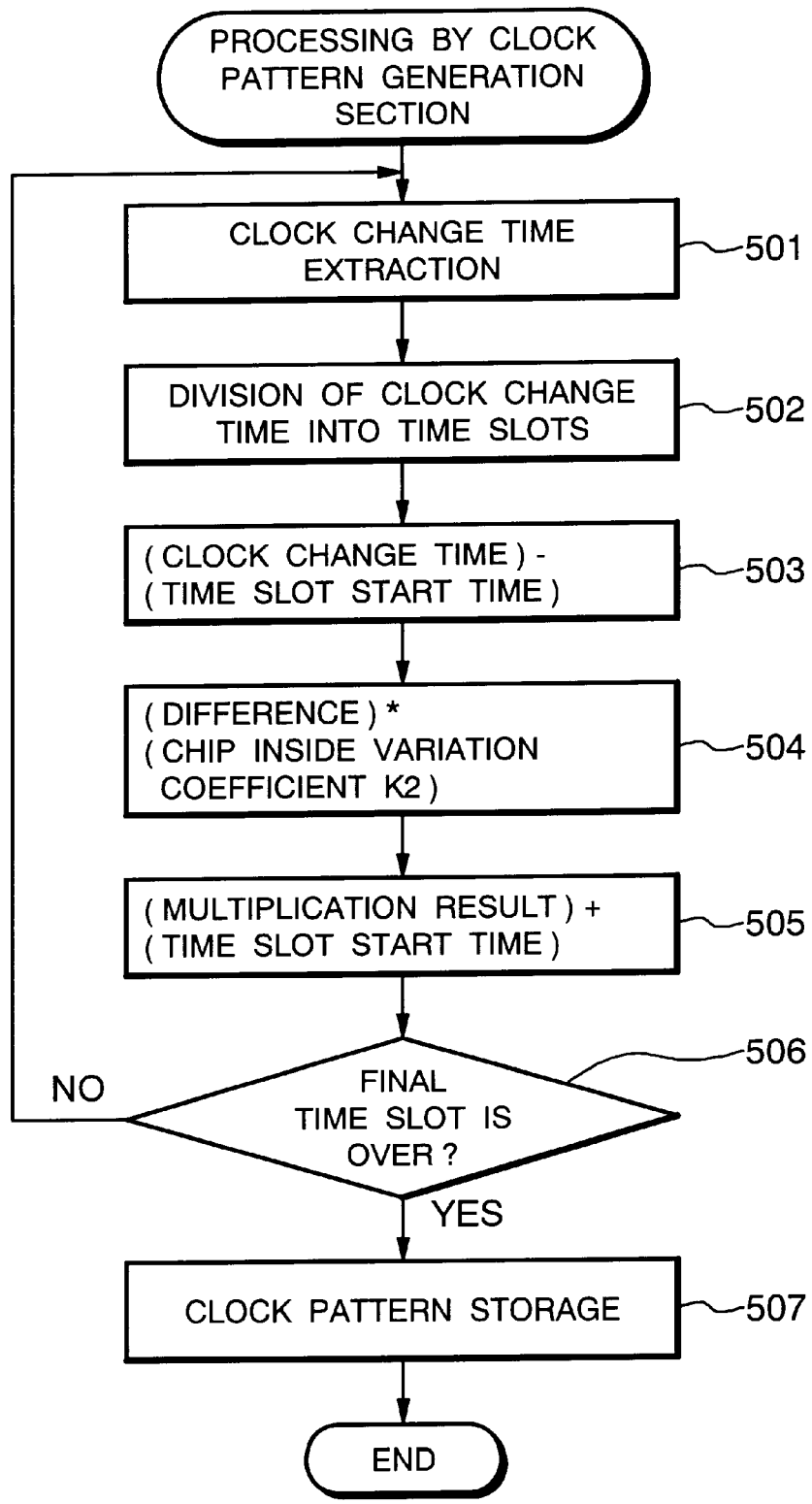
FIG. 5 is a flowchart illustrating the operation of the clock pattern generation section.
Figure 6:
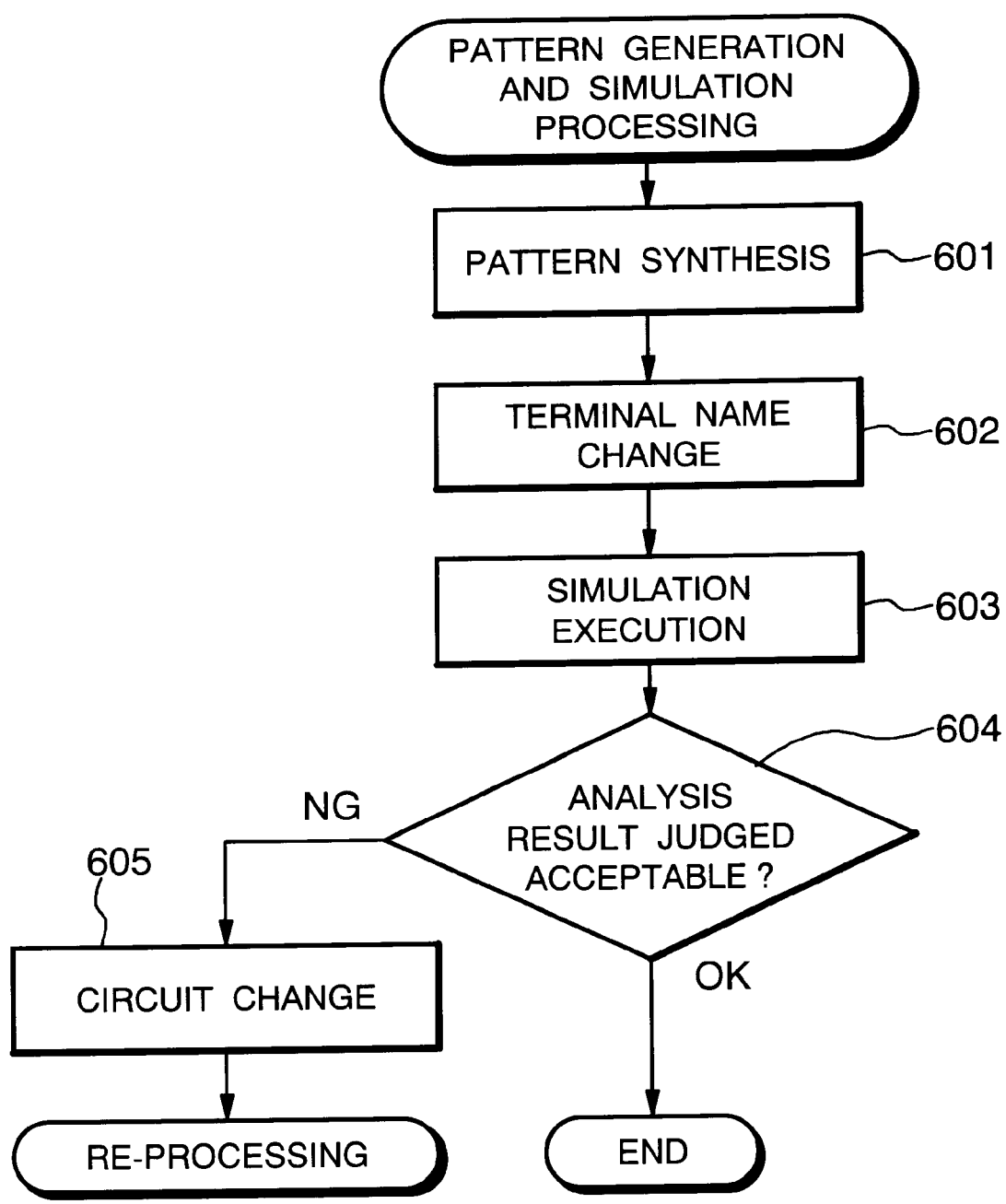
FIG. 6 is a flowchart illustrating the operation of the logic verification pattern generation section and the operation section.

FIG. 2 is a flowchart illustrating the processing by the connection data conversion section 10, FIG. 3 is a flowchart illustrating the processing by the dump data generation section 20, FIG. 4 is a flowchart illustrating the processing by the data pattern generation section 30, FIG. 5 is a flowchart illustrating the processing by the clock pattern generation section 40 and FIG. 6 is a flowchart illustrating the processing by the logic verification pattern generation section 60 and the processing after that.

Referring to FIG. 2, the connection data conversion section 10 firstly reads the connection data 101 (Step 201). It retrieves F/F system logic cells contained in the read connection data 101 (Step 202). It counts the number of signals used in the F/F system logic cells detected at Step 202 (Step 203). Next, the same number of terminals as the count of the number of signals obtained at Step 203 are generated (Step 204). the F/F system logic cells contained in the connection data 101 are separated (Step 205). Then, the connection data 102 between the separated F/F system logic cells and the terminals generated at Step 204 is generated (Step 206). All these processes above are executed by the connection data conversion section 10.

Referring to FIG. 3, the dump data generation section 20 firstly reads the connection data 101 and the logic verification pattern 103 (Step 301) and specifies the execution conditions for the logic simulation (Step 302). Next, it prepares the delay data using the read connection data 101 and the logic verification pattern 103 as well as the data stored in the delay library (Step 303). It executes the logic simulation according to the execution conditions as specified at Step 302 (Step 304). It extracts the dump data 104 specified by the result of the logic simulation execution (Step 305) and stores such dump data 104 to a predetermined file (Step 306). All these processes above are executed by the dump data generation section 20.

Next, using the dump data 104 generated by the dump data generation section 20, the data pattern generation section 30, the clock pattern generation section 40 and the expectation pattern generation section 50 execute processing in parallel.

Referring to FIG. 4, the data pattern generation section 30 firstly extracts the data input change time (Tn) for the F/F system logic cells from the dump data 104 generated by the dump data generation section 20 (Step 401). It divides the extracted data input change time (Tn) to time slot units (ΔT) having the predetermined cycles (Step 402). Then, the start time (Ts) of the time slot is subtracted from the data input change time (Tn) for each divided time slot (Step 403). The subtraction result (Δt) is multiplied by the first chip inside variation coefficient (k1) (Step 404) and the time slot start time (Ts) is added to the obtained multiplication result (Step 405). Then, it is judged whether the data input change time (Tn) subjected to processing exceeds the final time slot or not (Step 406). When it does not exceed the final time slot, the procedure returns to Step 401 and the processes to Step 406 are repeated. When it is judged at step 406 that the data input change time exceeds the final time slot, the edited data pattern 105 is output for storage in a certain file (Step 407).

Referring to FIG. 5, the clock pattern generation section 40 firstly extracts the clock input change time (Tn) for the F/F system logic cells from the dump data 104 generated by the dump data generation section 20 (Step 501). It divides the extracted clock input change time (Tn) to the time slot units (ΔT) having the predetermined cycles (Step 502). Then, the start time (Ts) of the time slot is subtracted from the clock input change time (Tn) for each divided time slot (Step 503). The subtraction result (Δt) is multiplied by the second chip inside variation coefficient (k2) (Step 504) and the time slot start time (Ts) is added to the obtained multiplication result (Step 505). Then, it is judged whether the clock input change time (Tn) subjected to processing exceeds the final time slot or not (Step 506). When it does not exceed the final time slot, the procedure returns to Step 501 and the processes to Step 506 are repeated. When it is judged at step 506 that the clock input change time exceeds the final time slot, the edited clock pattern 106 is output for storage in a certain file (Step 507).

Though not shown, at the same time as the processing by the data pattern generation section 30 and the clock pattern generation section 40, the expectation pattern generation section 50 extracts the output signals for the F/F system logic cells from the dump data 104 generated by the dump data generation section 20 and stores them as the expectation pattern 107 in a certain file.

Referring to FIG. 6, the logic verification pattern generation section 60 firstly reads the data pattern 105 generated by the data pattern generation section 30, the clock pattern 106 generated by the clock pattern generation section 40 and the expectation pattern 107 generated by the expectation pattern generation section 50 from the applicable files for their synthesis (Step 601). Then, the terminal names in the synthesized pattern are renamed to those corresponding to the connection data generated by the connection data conversion section 10 so as to generate the logic verification pattern 108 (Step 602).

Then, the operation section 70, using the connection data 102 generated by the connection data conversion section 10 and the logic verification pattern 108 generated by the logic verification pattern generation section 60, executes the logic simulation according to the execution conditions specified by the dump data generation section 20 (See FIG. 3, Step 302) (Step 603). Then, the result of such logic simulation is analyzed and judged (Step 604). If any discrepancy of expectation values are found in the expectation value check result or a timing error is observed, for example, it is judged that the circuit is affected by the chip inside variation. In this case, the configuration of the circuit subjected to the processing is changed (Step 605) and the procedure is repeated from the processing by the connection data conversion section 10 and the dump data generation section 20. On the other hand, if there is no problem in the judgment result at Step 604, all processes are terminated and the procedure goes to the simulation result output processing by the output section 80.

As described above, this embodiment enables determination of the delay value for each logic cell without referring to the delay table for each pattern during the process of logic simulation execution. This reduces the time required for processing and eliminates the need of a memory to maintain the delay table.

Next, referring to the circuit shown in FIG. 7, the specific operation in this embodiment will be described below.

Figure 7:
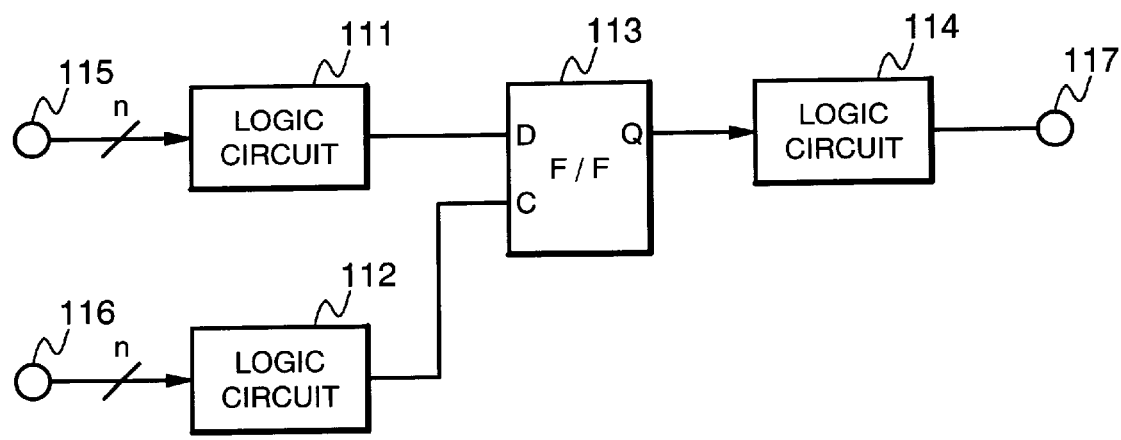
FIG. 7 is a schematic circuit diagram illustrating an example of the semiconductor integrated circuit subjected to the simulation according to this embodiment.
Figure 8:
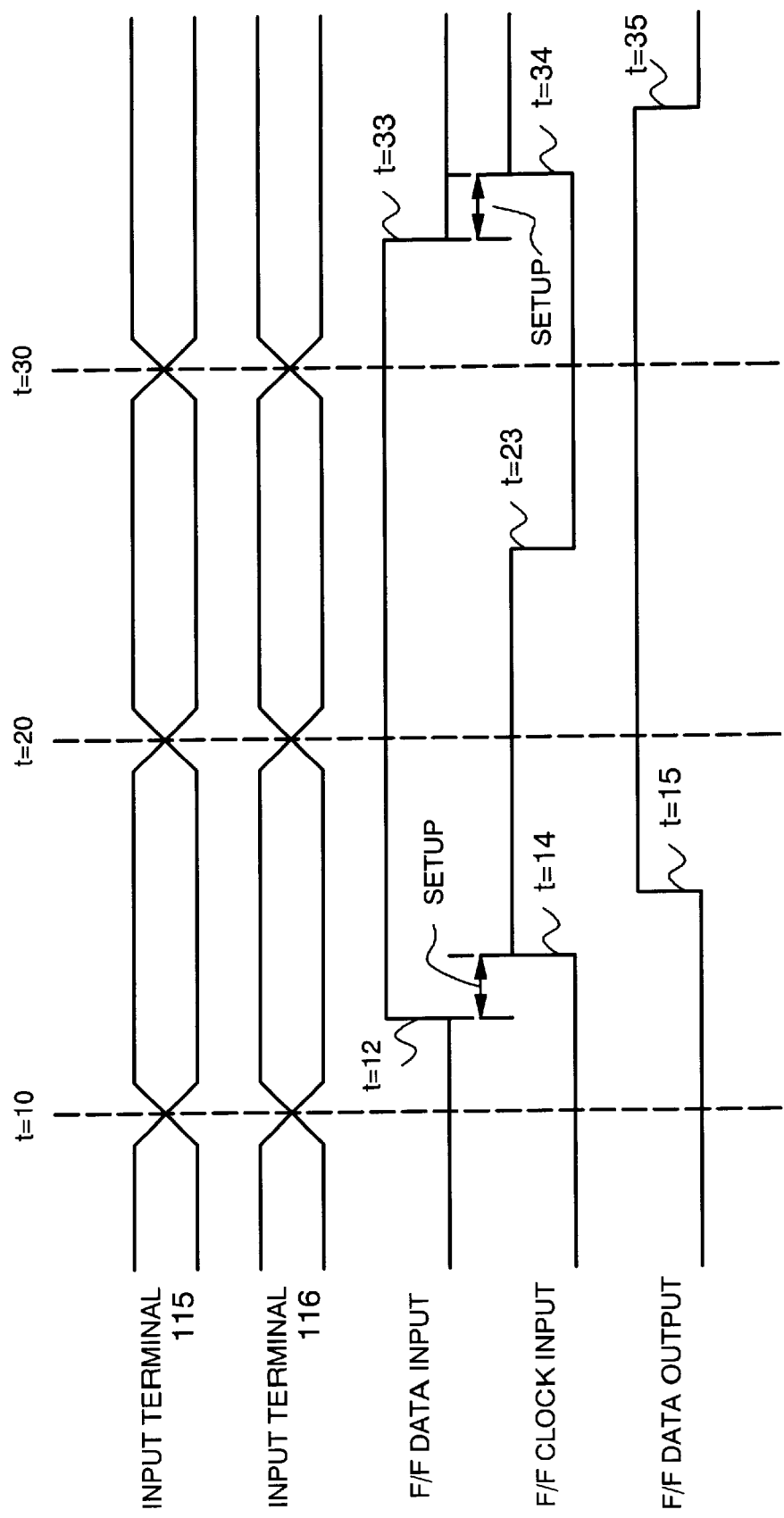
FIG. 8 is a timing chart showing the operation of the semiconductor integrated circuit of FIG. 7.

FIG. 7 is a schematic circuit diagram to show a configuration example of a semiconductor integrated circuit including logic circuits 111, 112 and 114 forming a combination circuit and a flip-flop (F/F) 113. FIG. 8 is a timing chart showing the result of the logic simulation for the circuit of FIG. 7.

In the semiconductor integrated circuit of FIG. 7, n input terminals 115 are connected with the logic circuit 111 and m input terminals 116 are connected with the logic circuit 112. The output from the logic circuit 111 is input to the data input terminal of the F/F 113 and the output from the logic circuit 112 is input to the clock input terminal of the F/F 113. The output from the F/F 113 is input to the logic circuit 114 and the output from the logic circuit 114 is output to outside via the output terminal 117.

The timing chart of FIG. 8 shows the data inputs at the input terminals 115 and 116, the data inputs at the data input terminal and the clock input terminal of the F/F 113 and the data output from the F/F 113. It also shows the input/output level changes of the F/F 113 corresponding to the data changes in the time slot units, which are for timings of t=10, 20 and 30.

Referring to FIG. 8, the data input to the F/F 113 changes at the timings of t=12 and t=33 and the clock input for the F/F 113 changes at the timings of t=14, 23 and 34, and the data output of the F/F 113 changes at the timings of t=15 and 35. Suppose here that the setup specification=1 and the hold specification=1 for the F/F 113. The data input changes at t=12 for a rise of the clock input at t=14. It has a margin for the setup specification=2 and the setup specification is satisfied for a rise of the clock input at the timing of t=34.

Figure 9:
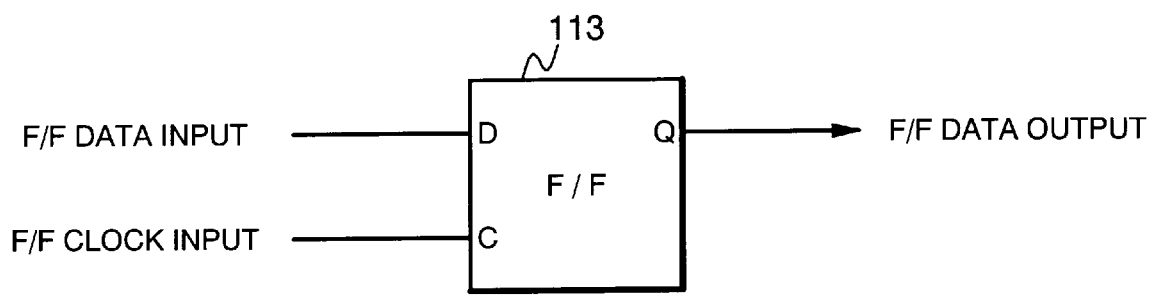
FIG. 9 is a schematic circuit diagram in relation to the flip-flop in the semiconductor integrated circuit of FIG. 7.

Referring to the flowcharts of FIGS. 2 to 6 at the same time, the number of F/F retrieved at Step 202 is 1 and the number of used terminals counted at Step 203 is 3 in the processing by the connection data conversion section 10 shown in FIG. 2. Three terminals are thus generated in the terminal generation processing at Step 204. Next, the F/F 113 is separated at step 205 and at Step 206, the connection data 102 between three terminals generated at Step 204 and the F/F 113 is prepared FIG. 9 shows the connection data 102 prepared at Step 206. As shown in the figure, the connection data 102 corresponds to the input/output of the F/F 113. The F/F 113 alone in FIG. 7 is separated and the input terminal 115 is connected to the data input terminal of the F/F 113, the input terminal 116 is connected to the clock input terminal of the F/F 113 and the data output terminal of the F/F 113 is connected to the output terminal 117.

In the processing by the dump data generation section 20 of FIG. 3, the dump data 104 obtained as a result of the logic simulation execution at Step 306 contains the timing data as shown in FIG. 8.

In the processing by the data pattern generation section 30 of FIG. 4, "t=12", which corresponds to the data input change time (Tn) for the F/F 113 is extracted at Step 401. At Step 402, the time slot start time ts=10 is extracted. At Step 403, as in the formula (2) below, the time slot start time ts=10 is subtracted from the data input change time t=12 for the F/F 113 for determination of Δt.

$$\Delta t = tn - ts$$

$$= 12 - 10 = 2 \qquad (2)$$

Next, at Step 404, Δt is multiplied by the chip inside variation coefficient k1. To verify the chip inside variation for the setup time and hold time specifications of the F/F 113, variations are provided to decrease the margin of the specification for the F/F 113. In other words, variation is provided to delay the data input to the F/F 113 or to urge the clock input to the F/F 113. For example, when the inside variation amount is 10%, the chip inside variation coefficient k1 is as shown by the formula (3) below.

$$k1 = 1 + 10(\%) = 1.1 \qquad (3)$$

Therefore, the variation value can be obtained by the formula (4) below.

Variation value=Δt×k1

$$= 2 \times 1.1 = 2.2 \qquad (4)$$

Next, at Step 405, the time slot start time ts=10 is added to the variation value=2.2.

Change time including variation=Variation value+ts $$= 2.2 + 10 = 12.2 \qquad (5)$$

According to the calculation above, t=12.2 is obtained as the change time including variation corresponding to the data input change time t=12 for the F/F 113.

With similar processing using the formulae (2) to (5) above, the change time including variation is determined for the data input change time t=33 for the F/F 113. Then, upon completion of calculation for the data input change time of the F/F 113 up to the final time slot, all calculation results are stored as the data pattern 105 to the certain file at Step 407.

In the processing by the clock pattern generation section 40 of FIG. 5, t=14 corresponding to the clock input change time (Tn) for the F/F 113 is extracted. At Step 502, the time slot start time ts=10 is extracted. At Step 503, as in the formula (6) below, the time slot start time ts=10 is subtracted from the clock input change time t=14 for the F/F 113 for determination of Δt.

$$\Delta t = tn - ts$$

$$= 14 - 10 = 4 \qquad (6)$$

Next, at Step 504, Δt is multiplied by the chip inside variation coefficient k2. To verify the chip inside variation for the hold specification of the F/F 113, variations are provided to delay the data input to the F/F or to urge the clock input to the F/F 113. For example, when the inside variation amount is 10%, the chip inside variation coefficient k2 is as shown by the formula (7) below.

$$k2 = 1 - 10(\%) = 0.9 \qquad (7)$$

Therefore, the variation value can be obtained by the formula (8) below:

Variation value=Δt×k2

$$= 4 \times 0.9 = 3.6 \qquad (8)$$

At Step 505, the time slot start time ts=10 is added to the variation value=3.6.

Change time including variation=variation value+ts $$= 3.6 + 10 = 13.6 \qquad (9)$$

According to the calculation above, t=13.6 is obtained as the change time including variation corresponding to the clock input change time t=14 for the F/F 113.

With similar processing using the formulae (6) to (9) above, the change time including variation is determined also for the clock input change time t=34 of the F/F 113. Then, upon completion of calculation for the clock input change time of the F/F 113 up to the final time slot, all calculation results are stored as the clock pattern 106 to the certain file at Step 507.

At the same time as the above processing by the data pattern generation section 30 and the clock pattern generation section 40, the expectation pattern generation section 50 extracts the output change time and the status value of the F/F 113 contained in the dump data 104 and stores them as the expectation pattern 107 to the certain file.

In the processing by the logic verification pattern generation section 60 and the operation section 70 as shown in FIG. 6, the data pattern 105, the clock pattern 106 and the expectation pattern 107 stored in the certain files of the above processing are synthesized at Step 601. Then, at Step 602, the signal names in the synthesized pattern are changed to the signal names corresponding to the connection data 102 prepared by the connection data conversion section 10 so that the logic verification pattern 108 is generated.

Figure 10:
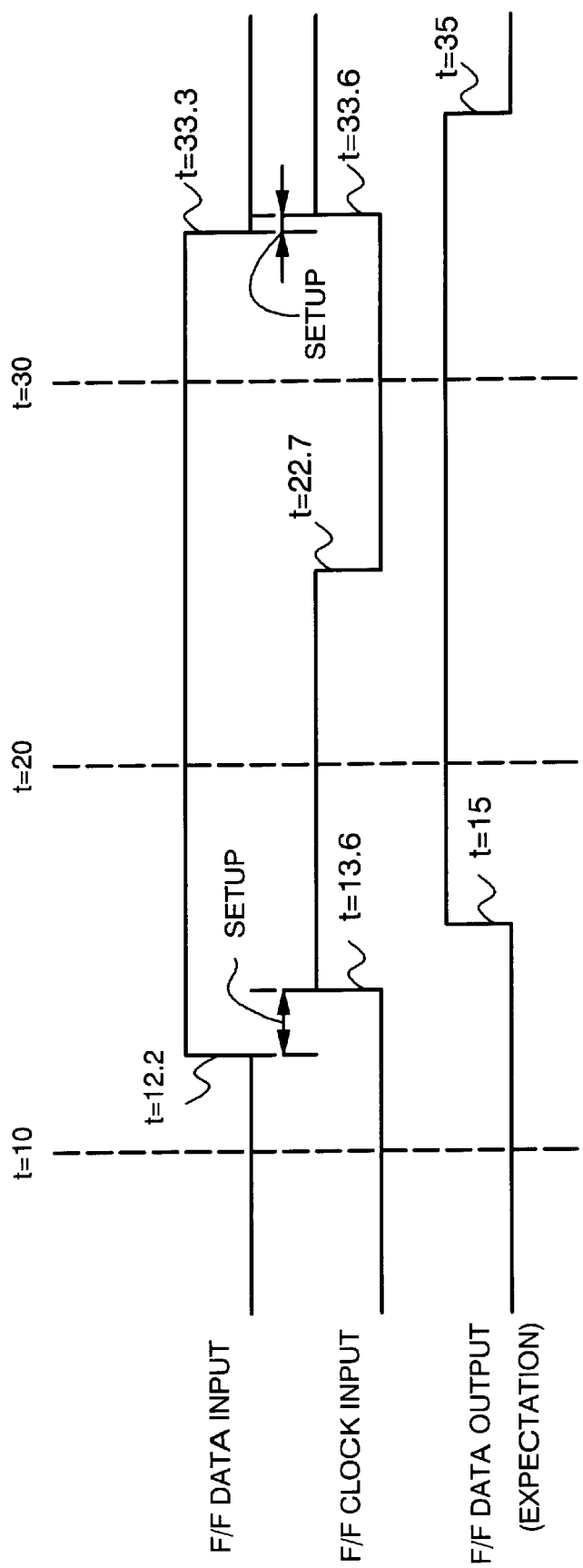
FIG. 10 is a timing chart illustrating the operation of the flip-flop shown in FIG. 9.

FIG. 10 is a timing chart related to the logic verification pattern 108 prepared at Step 602. Referring to FIG. 10, the data input for the F/F 113 in FIG. 9 changes at the timings of t=12.2 and t=33.3 and the clock input at t=13.6, t=22.7 and t=33.6. In addition, the expectation value of the data output for the F/F 113 changes at the timings of t=15 and t=35.

Then, at Step 603, the logic simulation is executed using the connection data 102 and the logic verification pattern 108. Referring to the timing chart of FIG. 10, the clock input rises at the timing of t=13.6 for the data input change of the F/F 113 at the timing of t=12.2. The setup of the F/F 113 for this timing is 1.2, which means that the setup specification=1 is satisfied. In contrast, the clock input rises at the timing of t=33.6 for the data input change of the F/F 113 at the timing of t=33.2. Since the setup of the F/F 113 for this timing is 0.3, the above timing results in the time out of specification. Therefore, in the judgment process at step 604, the semiconductor integrated circuit subjected to the processing is judged to be affected by the chip inside variation with the judgment result of NG. Thus, the circuit configuration is changed at Step 605 so as to repeat the above procedure.

Next, the detailed configuration of the functional sections in this embodiment will be described below.

Figure 11:
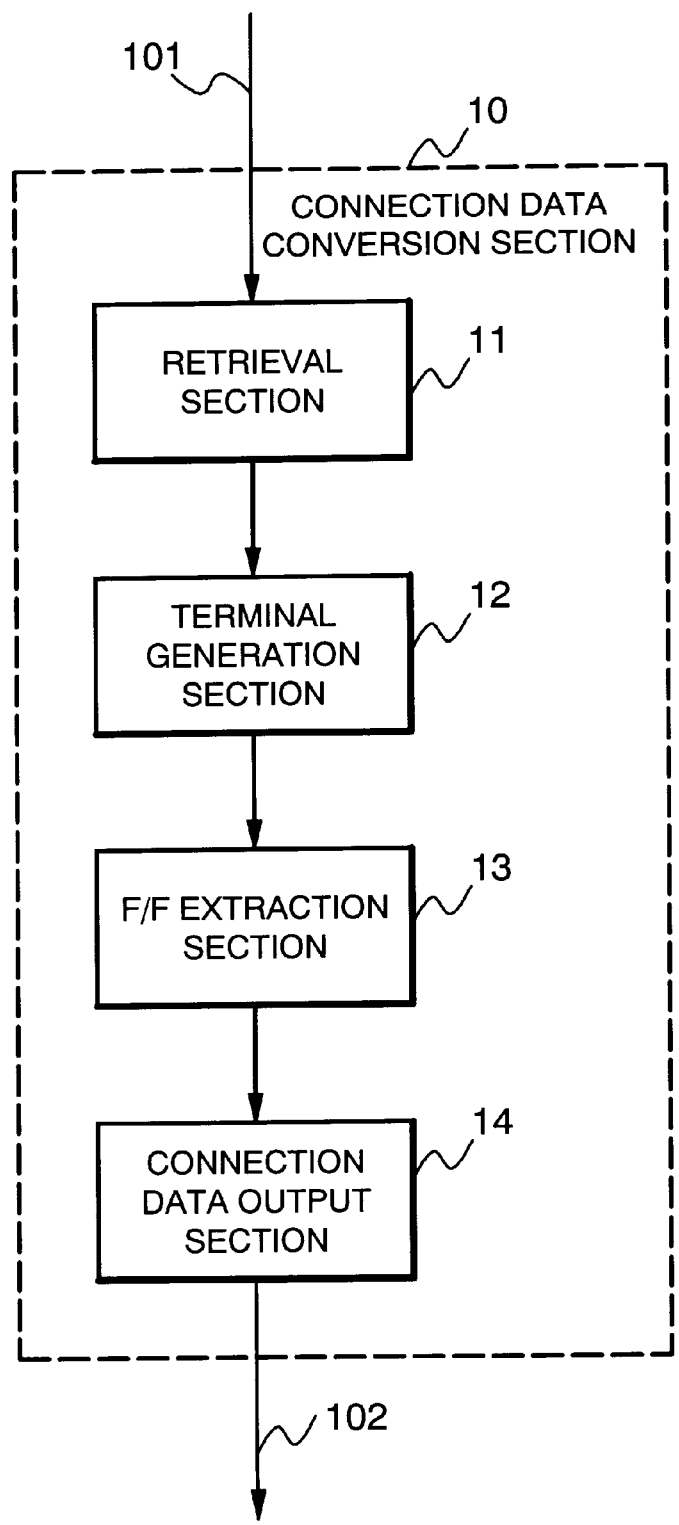
FIG. 11 is a block diagram to show a first configuration example of the connection data conversion section.

FIG. 11 is a block diagram to show a first configuration example of the connection data conversion section 10. The connection data conversion section 10 as shown in FIG. 11 comprises a retrieval section 11 which has the connection data 101 input and retrieves F/F system logic cells contained in such connection data 101, a terminal generation section 12 which generates the same number of external terminals as the total of the terminals used for signals in the detected F/F system logic cells, an F/F extraction section 13 which extracts the detected F/F system logic cells and a connection data output section 14 which generates and outputs the connection data 102 connecting the terminals of the extracted F/F system logic cells and the external terminals generated by the terminal generation section 12 in one-to-one relation.

Figure 12:
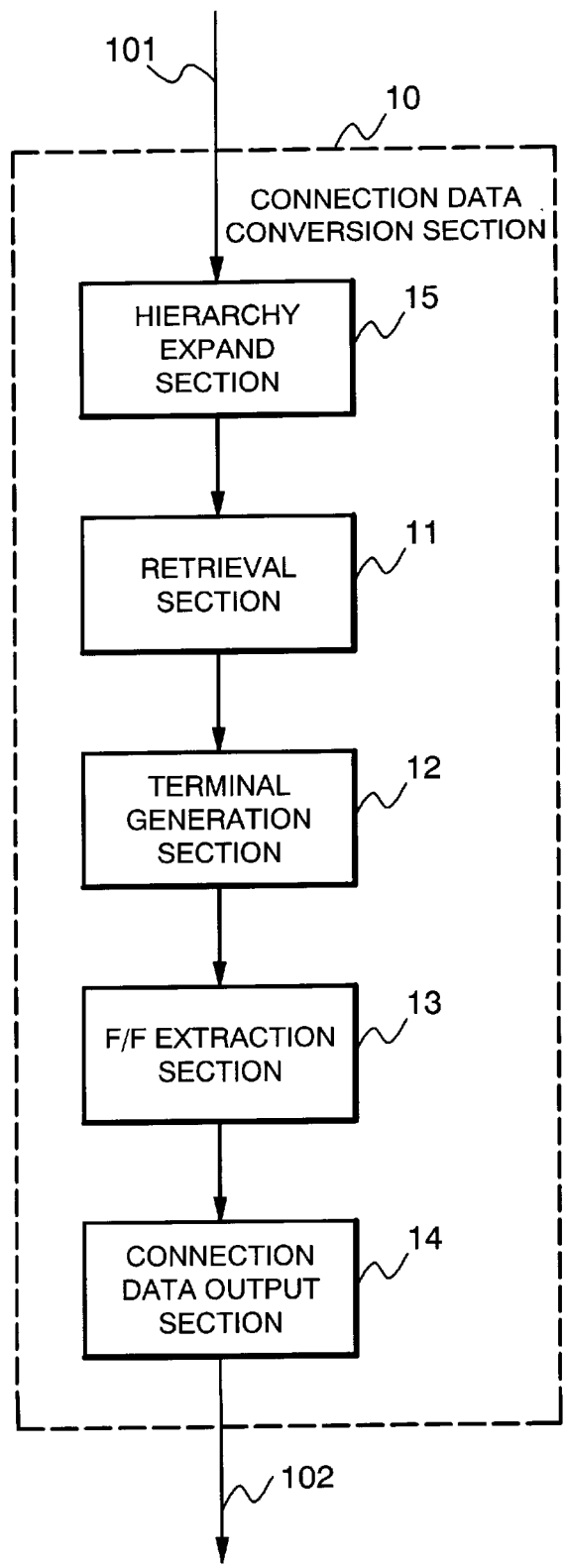
FIG. 12 is a block diagram to show a second configuration example of the connection data conversion section.

FIG. 12 is a block diagram to show a second configuration example of the connection data conversion section 10. This connection data conversion section 10 applies when the connection data 101 has a hierarchical structure. The connection data conversion section 12 as shown in FIG. 12 has, in addition to the retrieval section 11, the terminal generation section 12, the F/F extraction section 13 and the connection data output section 15 similar to those in the first configuration example of FIG. 11, a hierarchy expand section 15 which, prior to the retrieval of F/F system logic cells by the retrieval section 11, converts the connection data 101 so that its hierarchical structure is expanded to the logic cell level.

Figure 13:
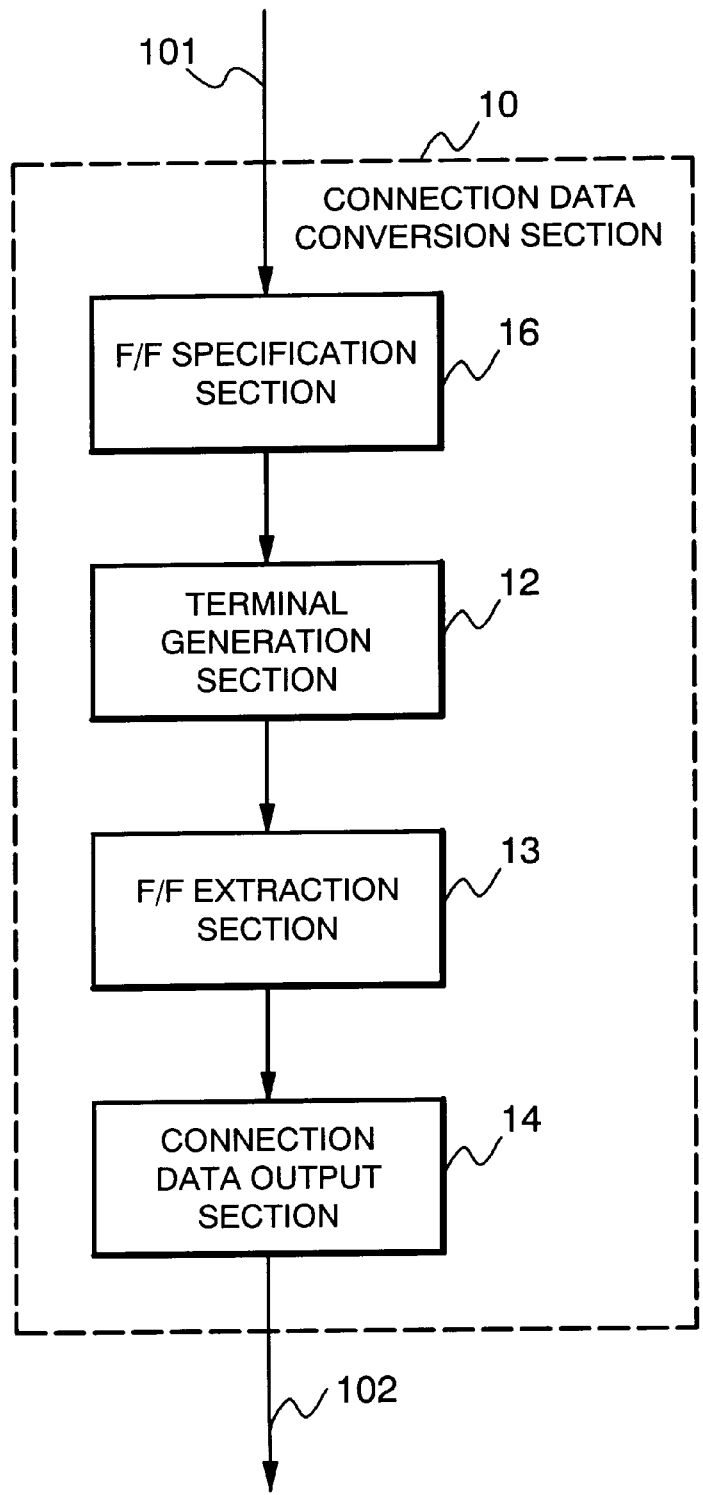
FIG. 13 is a block diagram to show a third configuration example of the connection data conversion section.

FIG. 13 is a block diagram to show a third configuration example of the connection data conversion section 10. This connection data conversion section 10 applies when some of the F/F system logic cells contained in the connection data 101 are anticipated to be affected by the chip inside variation and the F/F retrieval processing is omitted from the procedure. The connection data conversion section 10 as shown in FIG. 13 comprises an F/F specification section 16 which specifies one or more F/F system logic cell contained in the connection data 101, as well as a terminal generation section 12, an F/F extraction section 13 and a connection data output section 14 similar to those in the first configuration example of FIG. 11. When this connection data conversion section 10 is used, the F/F retrieval processing of Step 202 is replaced with the F/F specification processing in the flowchart of FIG. 2.

Figure 14:
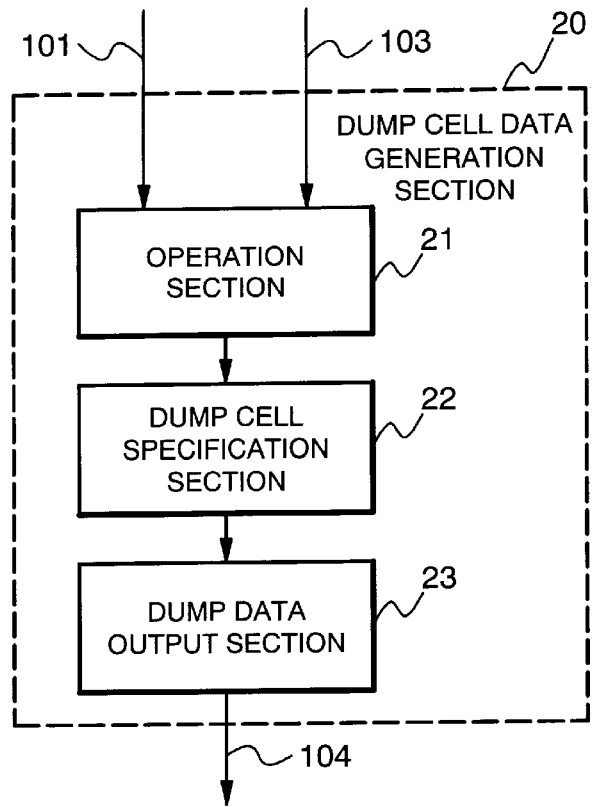
FIG. 14 is a block diagram to show a first configuration example of the dump data generation section.

FIG. 14 is a block diagram to show a first configuration example of the dump data generation section 20. The dump data generation section 20 as shown in FIG. 14 comprises an operation section 21 to execute the logic simulation using the connection data 101 and the logic verification pattern 103, a dump cell specification section 22 to specify one or more arbitrary logic cell contained in the connection data 101 after execution of the logic simulation by the operation section 21 and a dump data output section 23 to output the change time and the status value of the specified logic cell as the dump data 104.

Figure 15:
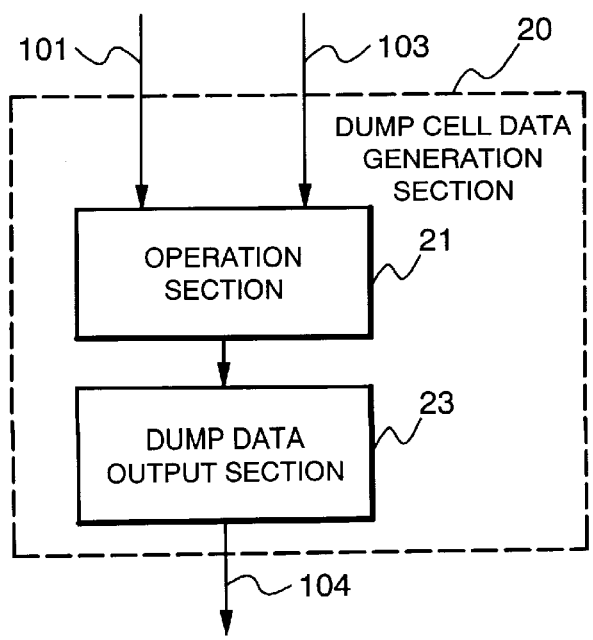
FIG. 15 is a block diagram to show a second configuration example of the dump data generation section.

FIG. 15 is a block diagram to show a second configuration example of the dump data generation section 20. The dump data generation section 20 as shown in FIG. 15 omits the dump cell specification section 22 in contrast to the dump data generation section 20 of FIG. 14. Thus, the processing to specify the logic cell at Step 305 in FIG. 3 is omitted here. The dump data output section 23 outputs, without specifying any logic cell, the dump data obtained from the result of the logic simulation by the operation section 21 as they are.

Figure 16:
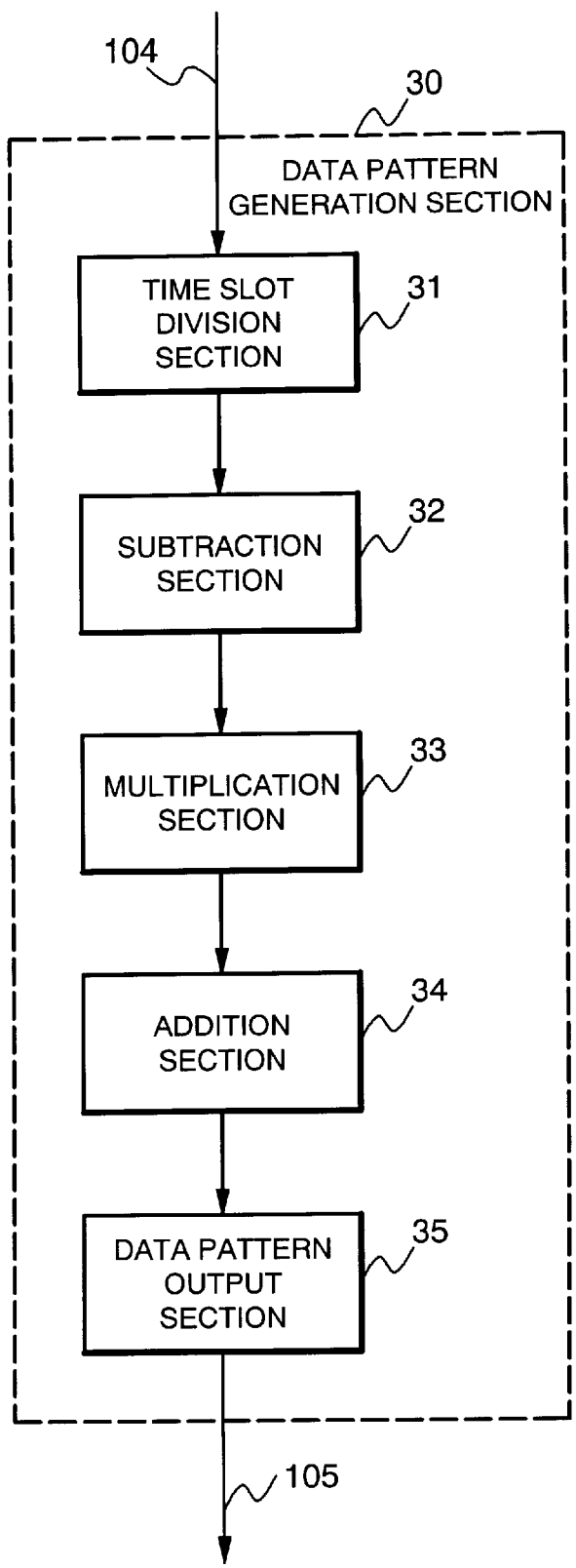
FIG. 16 is a block diagram to show a configuration example of the data pattern generation section.

FIG. 16 is a block diagram to show a configuration example of the data pattern generation section 30. The data pattern generation section 30 as shown in FIG. 16 comprises a time slot division section 31 which divides the change time in the dump data 104 to time slot units having the predetermined cycles, a subtraction (operation) section 32 to subtract the time slot start time from the change time at the data input terminal, the reset input terminal and the set input terminal of the F/F system logic cell contained in the time slots divided by the time slot division section 31, a multiplication section 33 which multiplies the subtraction result obtained by the subtraction section 32 by the first chip inside variation coefficient k1, an addition section 34 which adds the multiplication result obtained by the multiplication section 33 and the start time of the time slot and a data pattern output section 35 which outputs the addition result obtained by the addition section 34 as the data pattern 105.

Figure 17:
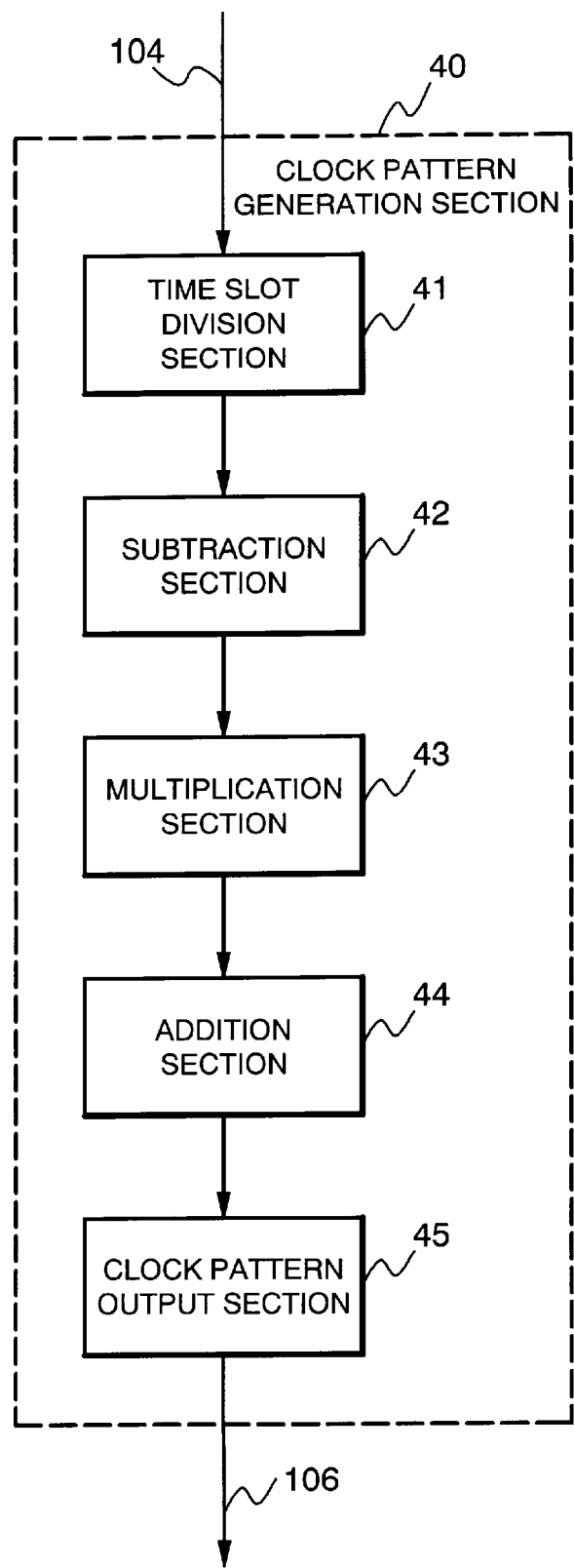
FIG. 17 is a block diagram to show a configuration example of the clock pattern generation section.

FIG. 17 is a block diagram to show a configuration example of the clock pattern generation section 40. The clock pattern generation section 40 as shown in FIG. 17 comprises a time slot division section 41 which divides the change time in the dump data 104 to time slot units having the predetermined cycles, a subtraction section 42 which subtracts the time slot start time from the change time at the clock input terminal of the F/F system logic cell contained in the time slots divided by the time slot division section 41, a multiplication section 43 which multiplies the subtraction result obtained by the subtraction section 42 by the second chip inside variation coefficient k2, an addition section 44 which adds the multiplication result obtained by the multiplication section 43 and the start time of the time slot and a clock pattern output section 45 which outputs the addition result obtained by the addition section 44 as the clock pattern 106.

Figure 18:
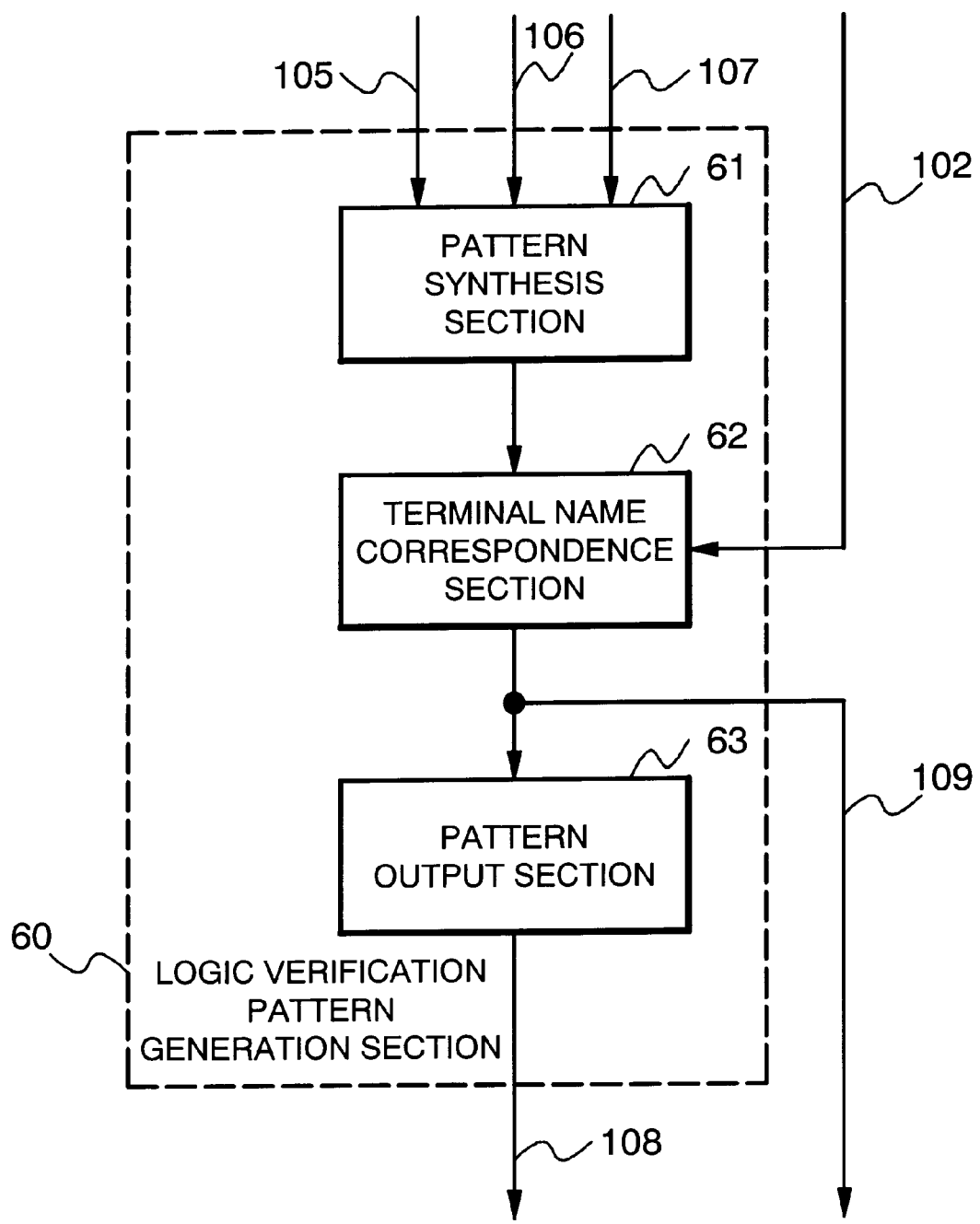
FIG. 18 is a block diagram to show a first configuration example of the logic verification pattern generation section.

FIG. 18 is a block diagram to show a first configuration example of the logic verification pattern generation section 60. The logic verification pattern generation section 60 as shown in FIG. 18 comprises a pattern synthesis section 61 which synthesizes the data pattern 105 output from the data pattern generation section 30, the clock pattern 106 output from the clock pattern generation section 40 and the expectation pattern 107 output from the expectation pattern generation section 50, a terminal name correspondence section 62 which changes the terminal names used in the patterns synthesized by the pattern synthesis section 61 to the terminal names in the connection data 102 input from the connection data conversion section 10 and generates and outputs a terminal name correspondence data 109 and a pattern output section 63 which outputs the pattern with the terminal names changed by the terminal name correspondence section 62 as the logic verification pattern 108.

Figure 19:
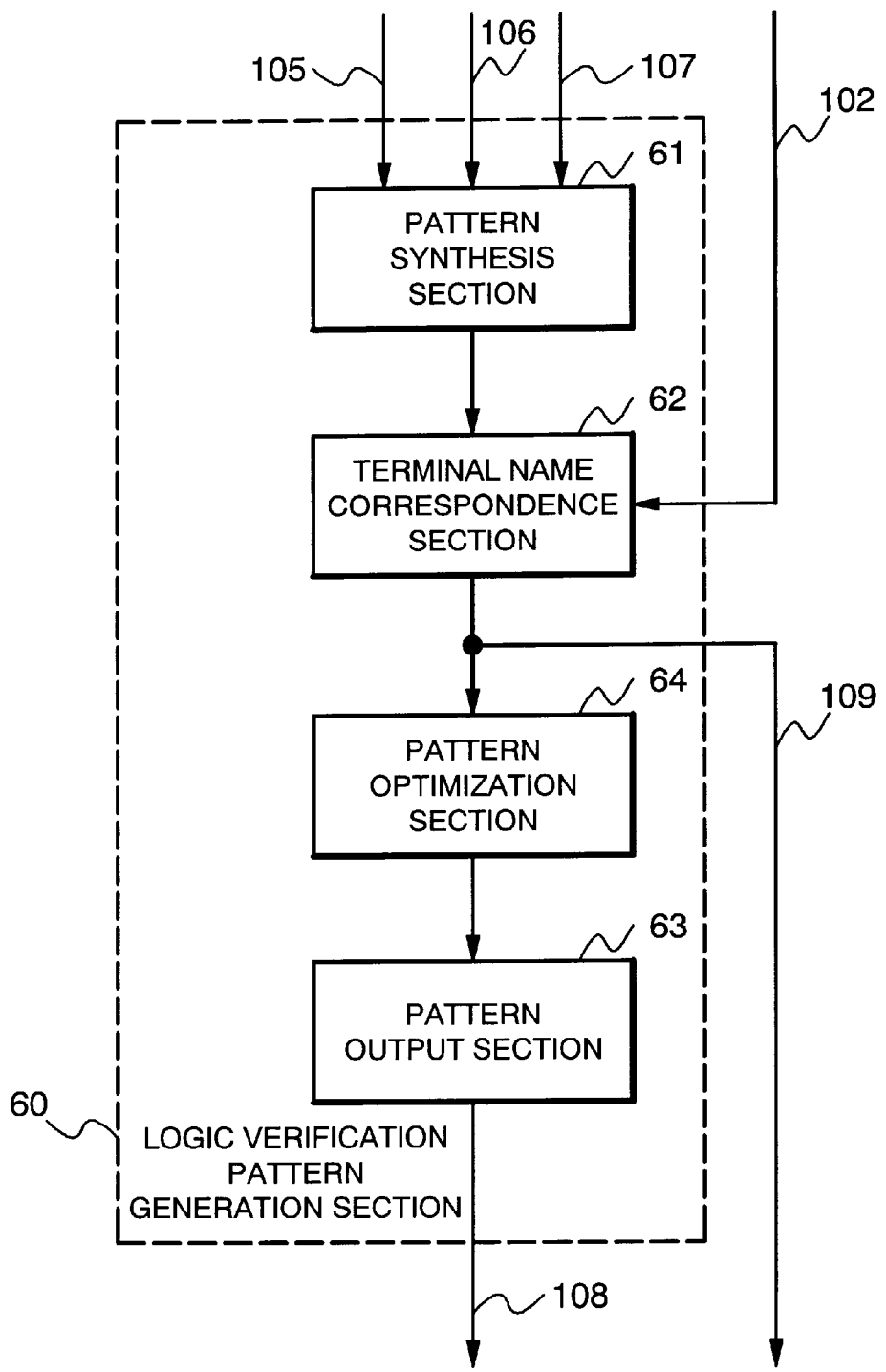
FIG. 19 is a block diagram to show a second configuration example of the logic verification pattern generation section.

FIG. 19 is a block diagram to show a second configuration example of the logic verification pattern generation section 60. The logic verification pattern generation section 60 as shown in FIG. 19 comprises, in addition to a pattern synthesis section 61, a terminal name correspondence section 62 and a pattern output section 63 as in the logic verification pattern generation section 60 of FIG. 18, a pattern optimization section 64 which deletes the logic cell pattern data not contained in the connection data 102 from the input terminal name correspondence data 109 generated by the terminal name correspondence section 62 before output of such data. The pattern output section 63 outputs the pattern optimized by the pattern optimization section 64 as the logic verification pattern 108. With the pattern optimization section 64, the logic verification pattern generation section 60 of FIG. 19 can delete unnecessary pattern data and thus improve the processing efficiency.

Next, the method to set the first chip inside variation coefficient k1 and the second chip inside variation coefficient k2 in the logic simulation of the present invention will be described below.

The variation coefficient is basically set so as to decrease the timing margin between the signal route for the clock input and the signal route for any signal input other than the clock signal in the F/F system logic cell. When the variation amount is y, the variation coefficients k1 and k2 may be one of the eight coefficient sets as shown with formulae (10) to (17) below.

$$k1 = 1 + y\%, \quad k2 = 1 - y\% \quad (10)$$

$$k1 = 1 - y\%, \quad k2 = 1 + y\% \quad (11)$$

$$k1 = 1 + y\%, \quad k2 = 1 \quad (12)$$

$$k1 = 1, \quad k2 = 1 - y\% \quad (13)$$

$$k1 = 1 - y\%, \quad k2 = 1 \quad (14)$$

$$k1 = 1, \quad k2 = 1 + y\% \quad (15)$$

$$k1 = 1 + y\%, \quad k2 = 1 + y\% \quad (16)$$

$$k1 = 1 - y\%, \quad k2 = 1 - y\% \quad (17)$$

Among the formulae above, the formulae (10) and (11) are used to verify the affect of variation over the setup time, hold time, release time and removal time of the F/F system logic cell. The formulae (12) and (13) are used to check the timing margin in relation to the setup time. The formulae (14) and (15) are used to check the timing margin in relation to the hold time.

Figure 20:
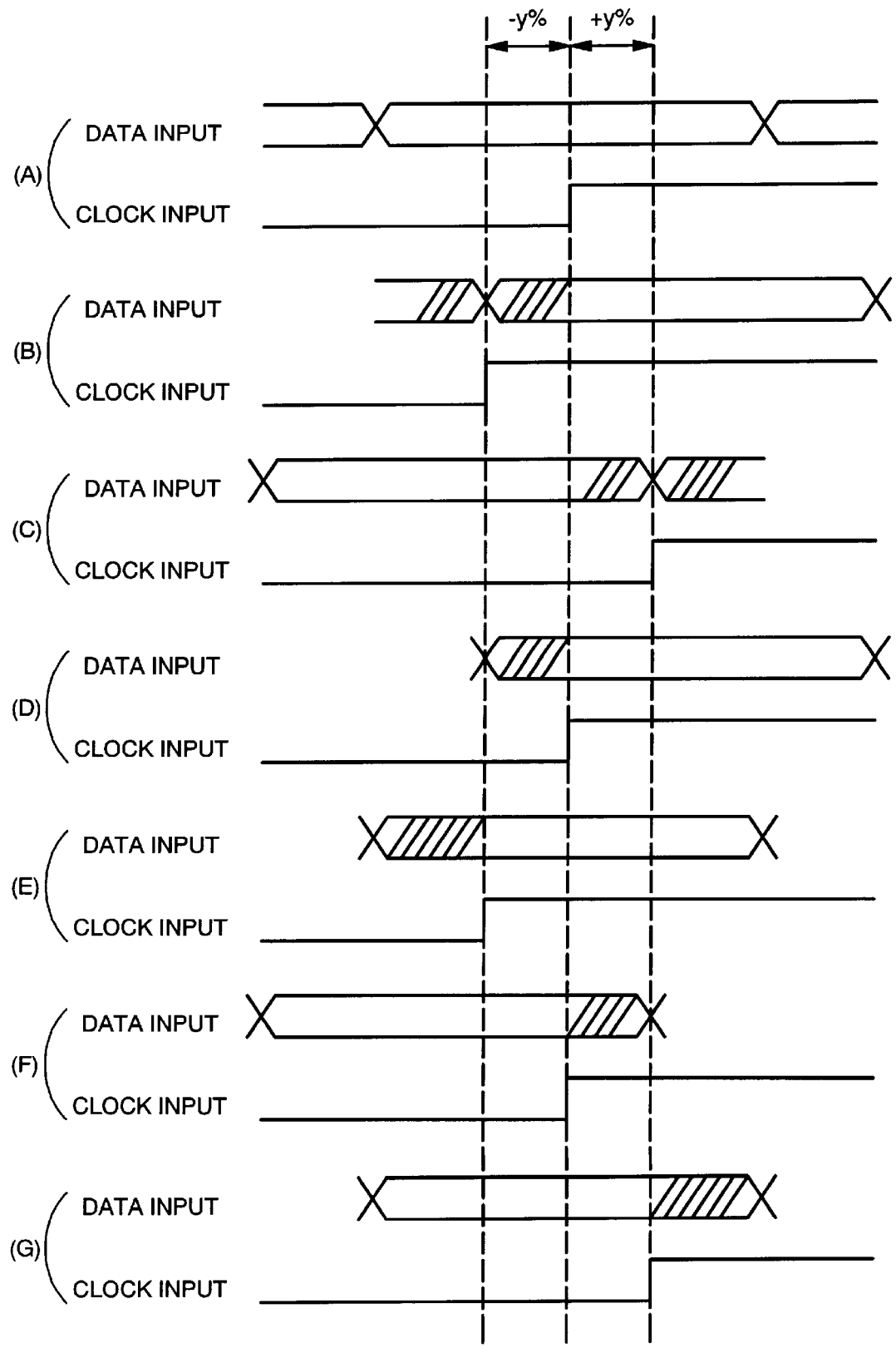
FIG. 20 shows timing charts illustrating examples of chip inside variation timings.
Figure 21:
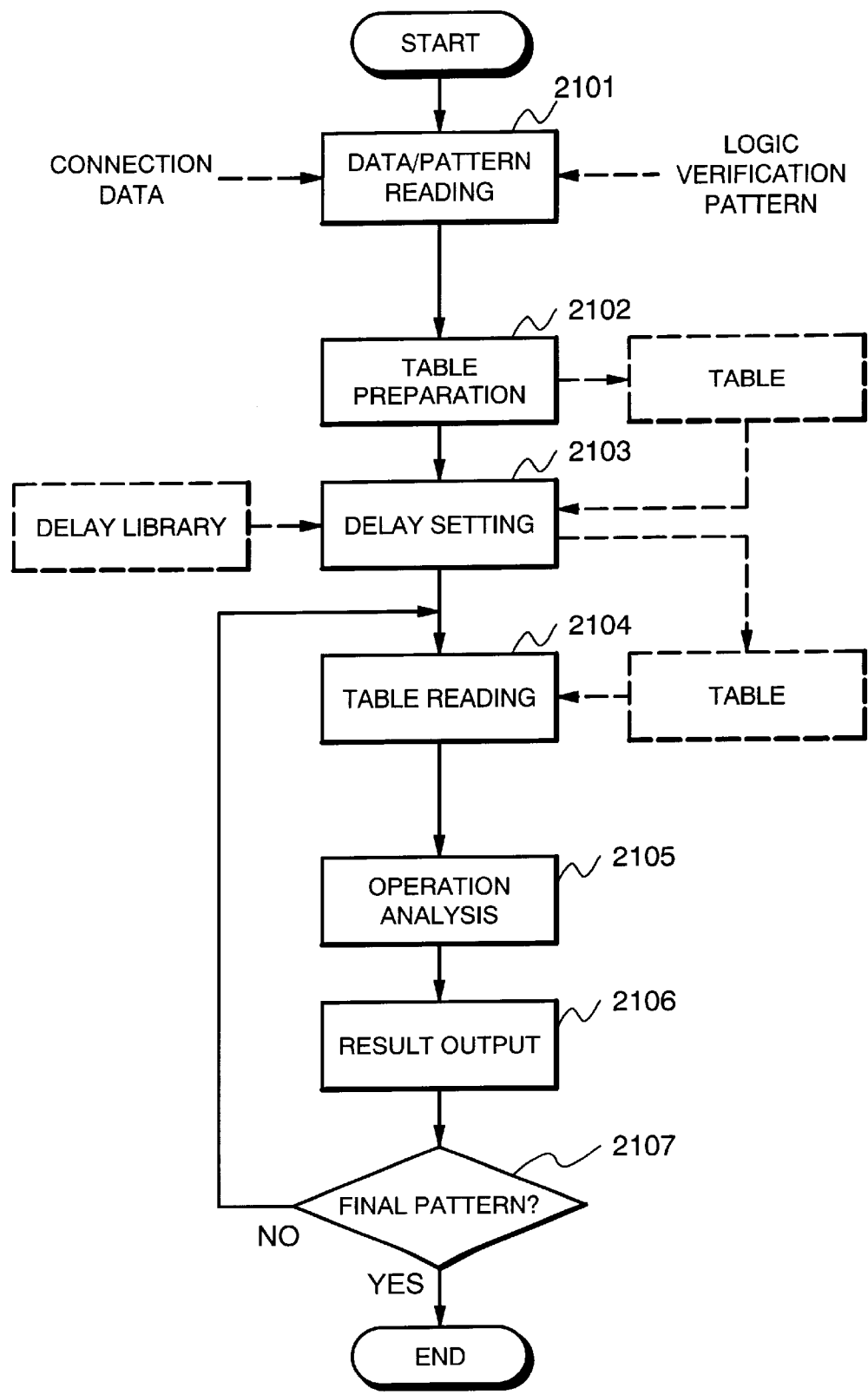
FIG. 21 is a flowchart illustrating the operation of a conventional logic simulation system.

FIG. 20 (A), (B), (C), (D), (E), (F) and (G) are timing charts to show the changes of the input timing according to the formulae (10) to (15). FIG. 20 (A) shows the relation between the data input and the clock input corresponding to the original dump data. FIG. 20 (B) shows the relation between the data input and the clock input corresponding to the formula (10), FIG. 20 (C) shows the relation between the data input and the clock input corresponding to (11), FIG. 20 (D) shows the relation between the data input and the clock input corresponding to (12), FIG. 20 (E) shows the relation between the data input and the clock input corresponding to (13), FIG. 20 (F) shows the relation between the data input and the clock input corresponding to (14) and FIG. 20 (G) shows the relation between the data input and the clock input corresponding to (15). In FIG. 20, shaded parts of the time area indicate the areas which may have timings out of specification.

The formula (16) is used when the original connection data is applied for realization with the fabrication process having slower delay values than the current logic cell or when problems about circuit configuration are extracted in relation to the connection data before layout. The formula (17) is used when the original connection data is applied for realization with the fabrication process having slower delay values than the current logic cell or when problems about circuit configuration are extracted in relation to the connection data before layout.

As described above, the logic simulation system of the present invention does not require a process to refer to the delay table for each pattern in order to determine the delay value of each logic cell during the procedure of the logic simulation execution. This eliminates the need of a large memory capacity, which has been required in a conventional system to maintain the delay table. At the same time, exclusion of man-hours to prepare the delay table reduces the processing time for the logic simulation, which results in improvement of the processing efficiency.

Besides, its capability of logic verification focusing on the signal routes corresponding to the flip-flop logic cell realizes proper verification about whether or not there is any problem for each signal route even when many logic steps are involved in the signal route.

In contrast to the conventional logic simulation which could just judge whether there is a variation affect problem or not and could not specify the flip-flop having a problem about the internal timing, the present invention can specify any F/F logic cell contained in the logic circuit and easily analyze whether there is any internal timing problem for the corresponding signal route.

The present invention can execute analysis for all flip-flops by the logic verification in a single logic simulation and verify whether there is any problem caused by variation inside the semiconductor chip at the stage before the fabrication of the semiconductor integrated circuit. It can also extract problems in relation to the connection data before layout. These characteristics have the effect to improve the yield of semiconductor integrated circuits to form logic circuits.

Further, the system of the present invention enables the logic verification with using the existing delay library and the logic simulator and also allows the logic verification using existing connection data so as to examine the problems in realization with a different fabrication process. Thus, this system can execute the logic simulation more efficiently.

It is naturally understood that the present invention can be effectively applied also to semiconductor devices of hybrid type and multi-module type in general where the functional devices have unevenly varied delay values.

Although the invention has been illustrated and described with respect to exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiment set out above but to include all possible embodiments which can be embodies within a scope encompassed and equivalents thereof with respect to the feature set out in the appended claims.

What is claimed is:

1. A logic simulation system for simulating a logic operation in semiconductor integrated circuits, comprising:

a connection data conversion means for converting first connection data to second connection data in a certain format by separating flip-flop system logic cells from said first connection data;

a dump data generation means for generating dump data based on said first connection data and a logic verification pattern;

a data pattern generation means for extracting dump data of a data input terminal, reset input terminal and set input terminal of the flip-flop system logic cells contained in said dump data generated by said dump data generation means, and generating a data pattern reflecting a chip inside variation;

a clock pattern generation means for extracting dump data of a clock input terminal of the flip-flop system logic cells contained in said dump data generated by said dump data generation means, and generating a clock pattern reflecting the chip inside variation;

an expectation pattern generation means for extracting dump data of a data output terminal of the flip-flop system logic cells contained in said dump data generated by said dump data generation means, and generating an expectation pattern;

a logic verification pattern generation means for synthesizing said data pattern generated by said data pattern generation means, said clock pattern generated by said clock pattern generation means and said expectation pattern generated by said expectation pattern generation means and generating a logic verification pattern through processing according to said second connection data output from said connection data conversion means; and an operation means for executing a logic simulation based on said logic verification pattern generated by said logic verification pattern generation means and said second connection data output from said connection data conversion means.

2. A logic simulation system as set forth in claim 1, wherein said connection data conversion means further comprises:

a retrieval means for retrieving said flip-flop system logic cells contained in said first connection data, a terminal generation means for generating a same number of external terminals as a total number of terminals used for signals in the flip-flop system logic cells detected by said retrieval means, a flip-flop extraction means for said flip-flop system logic cells detected by said retrieval means, and a connection data output means for generating and outputting said second connection data to connect terminals of the flip-flop system logic cells extracted by said flip-flop extraction means and the external terminals generated by said terminal generation means in one-to-one relation.

3. A logic simulation system as set forth in claim 1, wherein said connection data conversion means further comprises:

a hierarchy expand means for converting said first connection data into connection data with the hierarchical structure expanded to the logic cell level, a retrieval means for retrieving said flip-flop system logic cells contained in said first connection data converted by said hierarchy expand means, a terminal generation means for generating a same number of external terminals as a total number of terminals used for signals in the flip-flop system logic cells detected by said retrieval means, a flip-flop extraction means for extracting the flip-flop system logic cells detected by said retrieval means, and a connection data output means for generating and outputting said second connection data to connect terminals of the flip-flop system logic cells extracted by said flip-flop extraction means and the external terminals generated by said terminal generation means in one-to-one relation.

4. A logic simulation system as set forth in claim 1, wherein said connection data conversion means further comprises:

a flip-flop specification means for specifying as a subject of processing one or more flip-flop system logic cells from the flip-flop system logic cells contained in said first connection data, a terminal generation means for generating the same number of external terminals as a total number of terminals used for signals in the flip-flop system logic cell specified by said flip-flop specification means, a flip-flop extraction means for extracting the flip-flop system logic cells detected by a retrieval means, and a connection data output means for generating and outputting said second connection data to connect terminals of the flip-flop system logic cells extracted by said flip-flop extraction means and the external terminals generated by said terminal generation means in one-to-one relation.

5. A logic simulation system as set forth in claim 1, wherein said dump data generation means further comprises:

a second operation means for executing the logic simulation based on said first connection data and said logic verification pattern, a dump cell specification means which, after logic simulation execution by said second operation means, specifies one or more logic cells contained in said first connection data, and a dump data output means for outputting a change time and a status value of the one or more logic cells specified by said dump cell specification means as the dump data.

6. A logic simulation system as set forth in claim 1, wherein said dump data generation means further comprises:

a second operation means for executing the logic simulation based on said first connection data and said logic verification pattern, a dump cell specification means which, after logic simulation execution by said second operation means, specifies one or more logic cell contained in said connection data, and a dump data output means for outputting a change time and a status value of the one or more logic cells specified by said dump cell specification means as the dump data, wherein said second operation means is provided with a library storing delay values for the logic cells corresponding to a plurality of predetermined fabrication conditions, and obtains library data related to fabrication conditions specified for execution of the logic simulation by referring to said library and executes the logic simulation.

7. A logic simulation system as set forth in claim 1, wherein said dump data generation means further comprises:

a second operation means for executing the logic simulation based on said first connection data and said logic verification pattern, and a dump data output means for outputting a result of the logic simulation by said second operation means as the dump data.

8. A logic simulation system as set forth in claim 1, wherein said dump data generation means further comprises:

a second operation means for executing the logic simulation based on said first connection data and said logic verification pattern, and a dump data output means for outputting a result of the logic simulation by said second operation means as the dump data, wherein said second operation means is provided with a library storing delay values for the logic cells corresponding to a plurality of predetermined fabrication conditions, obtains library data related to the fabrication condition specified for execution of the logic simulation by referring to said library and executes the logic simulation.

9. A logic simulation system as set forth in claim 1, wherein said data pattern generation means further comprises:

a time slot division means for dividing a change time in the dump data input from said dump data generation means into time slot units having predetermined cycles, a subtraction means for subtracting a start time of a time slot from a change time at the data input terminal, the reset input terminal and the set input terminal of the flip-flop system logic cell contained in a time slot divided by said time slot division means, a multiplication means for multiplying a subtraction result obtained by said subtraction means by a first chip inside variation coefficient, which is set so as to decrease a timing margin between a signal route for a clock input and a signal route for any signal input other than the clock signal in said flip-flop system logic cell, an addition means for adding a multiplication result obtained by said multiplication means and the start time of said time slot, and a data pattern output means for outputting an addition result obtained by said addition means as the data pattern.

10. A logic simulation system as set forth in claim 1, wherein said clock pattern generation means further comprises:

a time slot division means for dividing a change time in the dump data input from said dump data generation means into time slot units having predetermined cycles, a subtraction means for subtracting a start time of a time slot from a change time at the clock input terminal of the flip-flop system logic cell contained in a time slot divided by said time slot division means, a multiplication means for multiplying a subtraction result obtained by said subtraction means by a second chip inside variation coefficient, which is set so as to decrease a timing margin between a signal route for a clock input and a signal route for any signal input other than the clock signal in said flip-flop system logic cell, an addition means for adding a multiplication result obtained by said multiplication means and the start time of said time slot, and a data pattern output means for outputting an addition result obtained by said addition means as the clock pattern.

11. A logic simulation system as set forth in claim 1, wherein said logic verification pattern generation means further comprises:

a pattern synthesis means for synthesizing the data pattern output from said data pattern generation means, the clock pattern output from said clock pattern generation means and the expectation pattern output from said expectation pattern generation means, a terminal name correspondence means for changing terminal names used in the patterns synthesized by said pattern synthesis means to terminal names in said second connection data output from said data conversion means and generating terminal name correspondence data, and a pattern output means for outputting a pattern having the terminal names changed by said terminal name correspondence means as the logic verification pattern.

12. A logic simulation system as set forth in claim 1, wherein said logic verification patter generation means further comprises;

a pattern synthesis means for synthesizing the data pattern output from said data pattern generation means, the clock pattern output from said clock pattern generation means and the expectation pattern output from said expectation pattern generation means, a terminal name correspondence means for changing terminal names used in the patterns synthesized by said pattern synthesis means to terminal names in said second connection data output from said data conversion means and generating terminal name correspondence data, a pattern optimization means for deleting pattern data of the logic cells not contained in said second connection data output from said connection data conversion means among the terminal name correspondence data generated by said terminal name correspondence means before output, and a pattern output means for outputting a pattern optimized by said pattern optimization means as the logic verification pattern.

13. A logic simulation system as set forth in claim 1, wherein said data pattern generation means further comprises:

a time slot division means for dividing a change time in the dump data input from said dump data generation means into time slot units having predetermined cycles, a subtraction means for subtracting a start time of a time slot from a change time at the data input terminal, the reset input terminal and the set input terminal of the flip-flop system logic cell contained in a time slot divided by said time slot division means, a multiplication means for multiplying a subtraction result obtained by said subtraction means by a first chip inside variation coefficient, which is set so as to decrease a timing margin between a signal route for a clock input and a signal route for any signal input other than the clock signal in said flip-flop system logic cell, an addition means for adding a multiplication result obtained by said multiplication means and the start time of said time slot, and a data pattern output means for outputting an addition result obtained by said addition means as the data pattern, said clock pattern generation means further comprising:

a time slot division means for dividing a change time in the dump data input from said dump data generation means into time slot units having predetermined cycles, a subtraction means for subtracting a start time of a time slot from a change time at the clock input terminal of the flip-flop system logic cell contained in a time slot divided by said time slot division means, a multiplication means for multiplying a subtraction result obtained by said subtraction means by a second chip inside variation coefficient, which is set so as to decrease a timing margin between a signal route for a clock input and a signal route for any signal input other than the clock signal in said flip-flop system logic cell, an addition means for adding a multiplication result obtained by said multiplication means and the start time of said time slot, and a data pattern output means for outputting an addition result obtained by said addition means as the clock pattern, said logic verification pattern generation means further comprising:

a pattern synthesis means for synthesizing the data pattern output from said data pattern generation means, the clock pattern output from said clock pattern generation means and the expectation pattern output from said expectation pattern generation means, a terminal name correspondence means for changing terminal names used in the patterns synthesized by said pattern synthesis means to terminal names in said second connection data output from said data conversion means and generating terminal name correspondence data, and a pattern output means for outputting a pattern having the terminal names changed by said terminal name correspondence means as the logic verification pattern.

14. A logic simulation system as set forth in claim 1, wherein said dump data generation means further comprises:

a second operation means for executing the logic simulation based on said first connection data and said logic verification pattern, a dump cell specification means which, after logic simulation execution by said second operation means, specifies one or more logic cells contained in said connection data, and a dump data output means for outputting a change time and a status value of the one or more logic cells specified by said dump cell specification means as the dump data, said data pattern generation means further comprising:

a time slot division means for dividing a change time in the dump data input from said dump data generation means into time slot units having predetermined cycles, a subtraction means for subtracting a start time of a time slot from a change time at the data input terminal, the reset input terminal and the set input terminal of the flip-flop system logic cell contained in a time slot divided by said time slot division means, a multiplication means for multiplying a subtraction result obtained by said subtraction means by a first chip inside variation coefficient, which is set so as to decrease a timing margin between a signal route for a clock input and a signal route for any signal input other than the clock signal in said flip-flop system logic cell, an addition means for adding a multiplication result obtained by said multiplication means and the start time of said time slot, and a data pattern output means for outputting an addition result obtained by said addition means as the data pattern, said clock pattern generation means further comprising:

a time slot division means for dividing a change time in the dump data input from said dump data generation means into time slot units having predetermined cycles, a subtraction means for subtracting a start time of a time slot from a change time at the clock input terminal of the flip-flop system logic cell contained in a time slot divided by said time slot division means, a multiplication means for multiplying a subtraction result obtained by said subtraction means by a second chip inside variation coefficient, which is set so as to decrease a timing margin between a signal route for a clock input and a signal route for any signal input other than the clock signal in said flip-flop system logic cell, an addition means for adding a multiplication result obtained by said multiplication means and the start time of said time slot, and a data pattern output means for outputting an addition result obtained by said addition means as the clock pattern, said logic verification pattern generation means further comprising:

a pattern synthesis means for synthesizing the data pattern output from said data pattern generation means, the clock pattern output from said clock pattern generation means and the expectation pattern output from said expectation pattern generation means, a terminal name correspondence means for changing terminal names used in patterns synthesized by said pattern synthesis means to terminal names in said second connection data output from said data conversion means and generating terminal name correspondence data, and a pattern output means for outputting a pattern having the terminal names changed by said terminal name correspondence means as the logic verification pattern.

15. A logic simulation system as set forth in claim 1, wherein said dump data generation means further comprises:

a second operation means for executing the logic simulation based on said first connection data and said logic verification pattern, a dump cell specification means which, after logic simulation execution by said second operation means, specifies one or more logic cells contained in said connection data, and a dump data output means for outputting a change time and a status value of the logic cell specified by said dump cell specification means as the dump data, wherein said second operation means is provided with a library storing delay values for the logic cells corresponding to a plurality of predetermined fabrication conditions, and obtains library data related to fabrication conditions specified for execution of the logic simulation by referring to said library and executes the logic simulation, said data pattern generation means further comprising:

a time slot division means for dividing a change time in the dump data input from said dump data generation means into time slot units having predetermined cycles, a subtraction means for subtracting a start time of a time slot from a change time at the data input terminal, the reset input terminal and the set input terminal of the flip-flop system logic cell contained in a time slot divided by said time slot division means, a multiplication means for multiplying a subtraction result obtained by said subtraction means by a first chip inside variation coefficient, which is set so as to decrease a timing margin between a signal route for a clock input and a signal route for any signal input other than the clock signal in said flip-flop system logic cell, an addition means for adding a multiplication result obtained by said multiplication means and the start time of said time slot, and a data pattern output means for outputting an addition result obtained by said addition means as the data pattern, said clock pattern generation means further comprising:

a time slot division means for dividing a change time in the dump data input from said dump data generation means into time slot units having predetermined cycles, a subtraction means for subtracting a start time of a time slot from a change time at the clock input terminal of the flip-flop system logic cell contained in a time slot divided by said time slot division means, a multiplication means for multiplying a subtraction result obtained by said subtraction means by a second chip inside variation coefficient, which is set so as to decrease a timing margin between a signal route for a clock input and a signal route for any signal input other than the clock signal in said flip-flop system logic cell, an addition means for adding a multiplication result obtained by said multiplication means and the start time of said time slot, and a data pattern output means for outputting the an addition result obtained by said addition means as the clock pattern, said logic verification pattern generation means further comprising:

a pattern synthesis means for synthesizing data pattern output from said data pattern generation means, the clock pattern output from said clock pattern generation means and the expectation pattern output from said expectation pattern generation means, a terminal name correspondence means for changing terminal names used in the patterns synthesized by said pattern synthesis means to terminal names in said second connection data output from said data conversion means and generating terminal name correspondence data, and a pattern output means for outputting a pattern having the terminal names changed by said terminal name correspondence means as the logic verification pattern.

16. A logic simulation system as set forth in claim 1, wherein said dump data generation means further comprises:

a second operation means for executing the logic simulation based on said first connection data and said logic verification pattern, and a dump data output means for outputting a result of the logic simulation by said second operation means as the dump data, said data pattern generation means further comprises:

a time slot division means for dividing a change time in the dump data input from said dump data generation means into time slot units having predetermined cycles, a subtraction means for subtracting a start time of a time slot from a change time at the data input terminal, the reset input terminal and the set input terminal of the flip-flop system logic cell contained in a time slot divided by said time slot division means, a multiplication means for multiplying a subtraction result obtained by said subtraction means by a first chip inside variation coefficient, which is set so as to decrease a timing margin between a signal route for the clock input and a signal route for any signal input other than the clock signal in said flip-flop system logic cell, an addition means for adding a multiplication result obtained by said multiplication means and the start time of said time slot, and a data pattern output means for outputting an addition result obtained by said addition means as the data pattern, said clock pattern generation means further comprising:

a time slot division means for dividing a change time in the dump data input from said dump data generation means into time slot units having predetermined cycles, a subtraction means for subtracting a start time of a time slot from a change time at a clock input terminal of the flip-flop system logic cell contained in a time slot divided by said time slot division means, a multiplication means for multiplying a subtraction result obtained by said subtraction means by a second chip inside variation coefficient, which is set so as to decrease a timing margin between a signal route for a clock input and a signal route for any signal input other than the clock signal in said flip-flop system logic cell, an addition means for adding a multiplication result obtained by said multiplication means and the start time of said time slot, and a data pattern output means for outputting an addition result obtained by said addition means as the clock pattern, said logic verification pattern generation means further comprising:

a pattern synthesis means for synthesizing the data pattern output from said data pattern generation means, the clock pattern output from said clock pattern generation means and the expectation pattern output from said expectation pattern generation means, a terminal name correspondence means for changing terminal names used in the patterns synthesized by said pattern synthesis means to terminal names in said second connection data output from said data conversion means and generating terminal name correspondence data, and a pattern output means for outputting a pattern having the terminal names changed by said terminal name correspondence means as the logic verification pattern.

17. A logic simulation system as set forth in claim 1, wherein said dump data generation means further comprises:

a second operation means for executing the logic simulation based on said first connection data and said logic verification pattern, and a dump data output means for outputting a result of the logic simulation by said second operation means as the dump data, wherein said second operation means is provided with a library storing delay values for the logic cells corresponding to a plurality of predetermined fabrication conditions, obtains library data related to the fabrication condition specified for execution of the logic simulation by referring to said library and executes the logic simulation, said data pattern generation means further comprising:

a time slot division means for dividing a change time in the dump data input from said dump data generation means into time slot units having predetermined cycles, a subtraction means for subtracting a start time of a time slot from a change time at the data input terminal, the reset input terminal and the set input terminal of the flip-flop system logic cell contained in a time slot divided by said time slot division means, a multiplication means for multiplying a subtraction result obtained by said subtraction means by a first chip inside variation coefficient, which is set so as to decrease a timing margin between a signal route for a clock input and a signal route for any signal input other than the clock signal in said flip-flop system logic cell, an addition means for adding a multiplication result obtained by said multiplication means and the start time of said time slot, and a data pattern output means for outputting an addition result obtained by said addition means as the data pattern, said clock pattern generation means further comprising:

a time slot division means for dividing a change time in the dump data input from said dump data generation means into time slot units having predetermined cycles, a subtraction means for subtracting a start time of a time slot from a change time at a clock input terminal of the flip-flop system logic cell contained in the time slot divided by said time slot division means, a multiplication means for multiplying a subtraction result obtained by said subtraction means by a second chip inside variation coefficient, which is set so as to decrease a timing margin between a signal route for a clock input and a signal route for any signal input other than the clock signal in said flip-flop system logic cell, an addition means for adding a multiplication result obtained by said multiplication means and the start time of said time slot, and a data pattern output means for outputting an addition result obtained by said addition means as the clock pattern, said logic verification pattern generation means further comprising:

a pattern synthesis means for synthesizing the data pattern output from said data pattern generation means, the clock pattern output from said clock pattern generation means and the expectation pattern output from said expectation pattern generation means, a terminal name correspondence means for changing terminal names used in the patterns synthesized by said pattern synthesis means to terminal names in said second connection data output from said data conversion means and generating terminal name correspondence data, and a pattern output means for outputting a pattern having the terminal names changed by said terminal name correspondence means as the logic verification pattern.

* * * * *